US010281821B2

(12) United States Patent
Matsuura

(10) Patent No.: US 10,281,821 B2
(45) Date of Patent: May 7, 2019

(54) EXPOSURE APPARATUS, EXPOSURE METHOD, AND DEVICE MANUFACTURING METHOD

(71) Applicant: Renesas Electronics Corporation, Koutou-ku, Tokyo (JP)

(72) Inventor: Seiji Matsuura, Ibaraki (JP)

(73) Assignee: Renesas Electronics Corporation, Tokyo (JP)

(*) Notice: Subject to any disclaimer, the term of this patent is extended or adjusted under 35 U.S.C. 154(b) by 4 days.

(21) Appl. No.: 15/640,488

(22) Filed: Jul. 1, 2017

(65) Prior Publication Data

US 2018/0081275 A1 Mar. 22, 2018

(30) Foreign Application Priority Data

Sep. 21, 2016 (JP) ................................. 2016-184087

(51) Int. Cl.
| | |
|---|---|
| *G03F 7/20* | (2006.01) |
| *G02B 27/28* | (2006.01) |
| *G03F 7/30* | (2006.01) |
| *H01L 21/027* | (2006.01) |
| *H01L 21/768* | (2006.01) |

(52) U.S. Cl.
CPC ........... *G03F 7/2006* (2013.01); *G02B 27/28* (2013.01); *G02B 27/286* (2013.01); *G03F 7/30* (2013.01); *G03F 7/701* (2013.01); *G03F 7/70566* (2013.01); *H01L 21/0275* (2013.01); *H01L 21/76816* (2013.01); *H01L 21/76877* (2013.01)

(58) Field of Classification Search
USPC ....................................................... 438/637
See application file for complete search history.

(56) References Cited

U.S. PATENT DOCUMENTS 6,404,482 B1* 6/2002 Shiraishi ............. G03F 7/70258
355/53
2005/0280794 A1* 12/2005 Tsuji ................... G03F 7/70191
355/67

(Continued)

FOREIGN PATENT DOCUMENTS

| JP | 2006-278979 A | 10/2006 |
|---|---|---|
| JP | 2010-093291 A | 4/2010 |

*Primary Examiner* — Marcos D. Pizarro
*Assistant Examiner* — Lawrence C Tynes, Jr.
(74) *Attorney, Agent, or Firm* — Shapiro, Gabor and Rosenberger, PLLC

(57) ABSTRACT

An exposure apparatus includes a polarizing member polarizing illumination light, and a filter having at least one opening. The polarizing member includes a first polarizing unit and a second polarizing unit arranged so as to surround the first polarizing unit. The second polarizing unit is configured so as to polarize the illumination light entering the second polarizing unit in the circumferential direction along the outer circumference of the first polarizing unit. At least a portion of the first polarizing unit is configured to polarize the illumination light in the direction orthogonal to the polarization direction in a part of the second polarizing unit located on the side opposite to the central part of the first polarizing unit. The openings are arranged in the filter so that the illumination light at the post stage of the filter and the polarizing member includes the illumination light polarized by the first and second polarizing units.

14 Claims, 19 Drawing Sheets

(56) References Cited

U.S. PATENT DOCUMENTS

| | | | |
|---|---|---|---|
| 2007/0002302 A1* | 1/2007 | Matsuura | G03F 7/701 355/71 |
| 2008/0165368 A1* | 7/2008 | Matsumoto | G03F 9/7026 356/614 |
| 2015/0227057 A1* | 8/2015 | Umezawa | G02F 1/133788 359/486.02 |

* cited by examiner

| | POINT | POLARIZATION BOUNDARY POSITION | DIPOLE ILLUMINATION CENTROID POSITION | RESOLUTION LIMIT | |
|---|---|---|---|---|---|
| | | | | y DIRECTION | x DIRECTION |
| RELATED TECHNIQUE | A | - | (+0.7, 0), (-0.7, 0) | 38 nm | 100 nm |
| EMBODIMENT | B | 0.7 | (+0.7, 0), (-0.7, 0) | 38 nm | 86 nm |
| | C | 0.7 | (+0.6, +0.3), (-0.6, -0.3) | 42 nm | 65 nm |

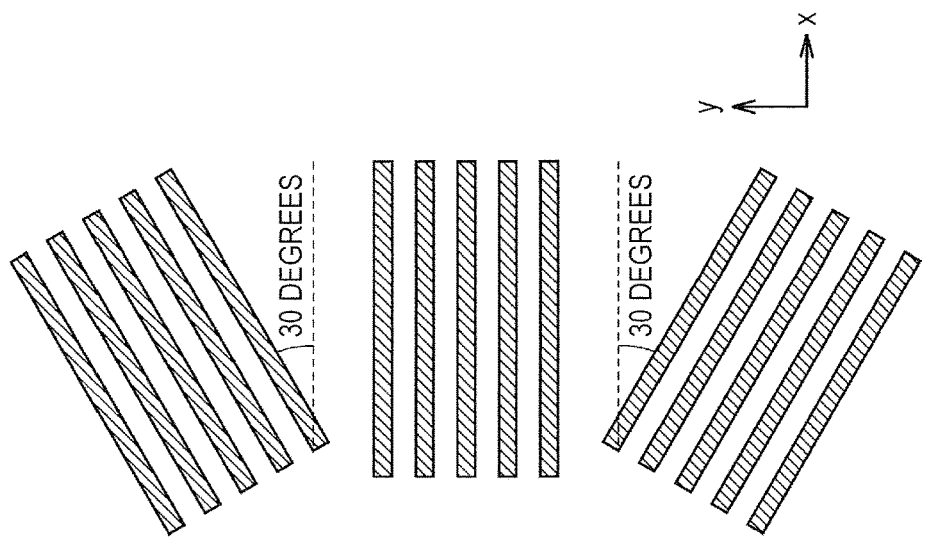
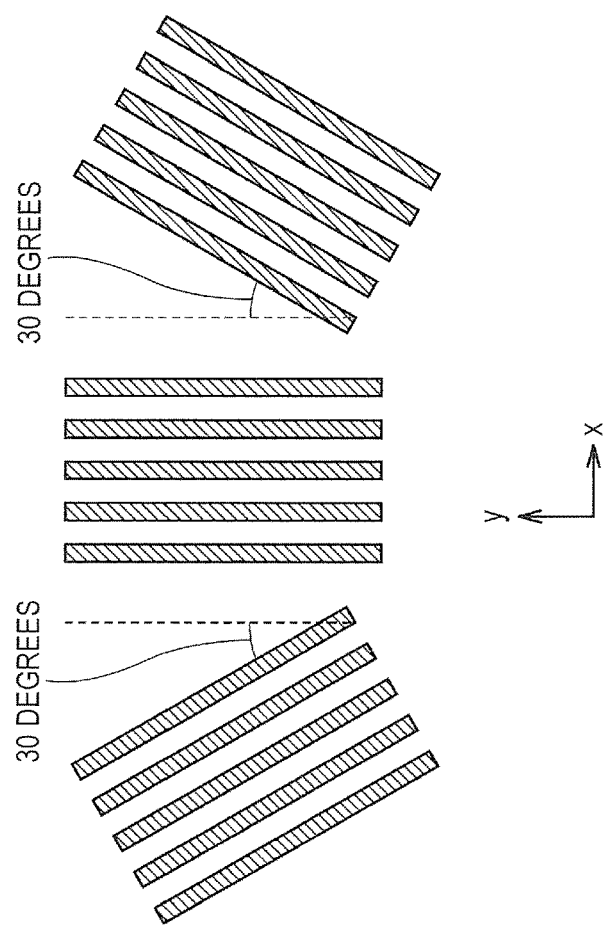

EXPOSURE APPARATUS, EXPOSURE METHOD, AND DEVICE MANUFACTURING METHOD

CROSS-REFERENCE TO RELATED APPLICATIONS

The disclosure of Japanese Patent Application No. 2016-184087 filed on Sep. 21, 2016 including the specification, drawings and abstract is incorporated herein by reference in its entirety.

BACKGROUND

The disclosure relates to an exposure apparatus, and more particularly to an exposure apparatus for manufacturing a semiconductor device.

In a semiconductor manufacturing process, a photolithography process for transferring a pattern onto a plane substrate using light has been known. In the photolithography process, a pattern formed on a photomask is transferred (exposed) to a photosensitive layer (photoresist) applied on a wafer by an exposure apparatus. As the exposure apparatus, a batch exposure-type projection exposure apparatus such as a stepper or a scanning exposure-type projection exposure apparatus such as a scanner is used.

Along with the recent improvement of a fine processing technique, a technique for increasing the resolution has been required for these exposure apparatuses. As a technique for increasing the resolution of the exposure apparatus, shortening the wavelength of an exposure light source or increasing the numerical aperture of a projection optical system has been known. However, the depth of focus of the projection optical system becomes smaller in inverse proportion to the square of the numerical aperture, and becomes smaller in proportion to the wavelength. Accordingly, a technique (technique for reducing k1) to increase the resolution without depending on these parameters has been required. As the technique for reducing k1, an irregular illumination method and a phase shift mask method have been known in the illumination field and the mask field, respectively.

Regarding the irregular illumination method to increase the resolution, Japanese Unexamined Patent Application Publication No. 2006-278979 discloses an exposure apparatus that uses one-row quadrupole illumination whose light quantity is increased by four secondary light sources arranged along a straight line parallel to the X-axis in a pupil surface of an illumination optical system when one-direction dense patterns aligned at predetermined pitches in the X-direction are exposed, and changes the polarization state of illumination light to linear polarization in the direction orthogonal to the X-axis using two outer secondary light sources and to linear polarization in the direction parallel to the X-axis using two inner secondary light sources (see "ABSTRACT").

Further, Japanese Unexamined Patent Application Publication No. 2010-093291 discloses an exposure apparatus that includes illumination pupil forming means to form, on or near a pupil surface of an illumination optical apparatus, illumination pupil distribution having light intensity distribution located at a central region including the optical axis and light intensity distribution located at a plurality of peripheral regions apart from the optical axis, and region changing means to change the position and size of the light intensity distribution located at the peripheral regions independently from the light intensity distribution located at the central region (see "ABSTRACT").

SUMMARY

However, in the techniques disclosed in Japanese Unexamined Patent Application Publication Nos. 2006-278979 and 2010-093291, the resolution of a pattern extending in a specific direction can be improved, but the resolution of a pattern extending in the direction orthogonal to the specific direction is decreased. Therefore, the exposure apparatus disclosed in each of Japanese Unexamined Patent Application Publication Nos. 2006-278979 and 2010-093291 has a problem that double patterning needs to be performed when exposing patterns extending in various directions.

The disclosure has been made to solve the problems as described above, and an object in a certain aspect is to provide an exposure apparatus that can increase the resolution of patterns extending in various directions. An object in another aspect is to provide a device manufacturing method using an exposure apparatus that can increase the resolution of patterns extending in various directions. An object in still another aspect is to provide an exposure method that can increase the resolution of patterns extending in various directions.

The other objects and novel features will become apparent from the description of the specification and the accompanying drawings.

An exposure apparatus according to an embodiment includes: a light source emitting illumination light for exposure; a polarizing member polarizing the illumination light; and a filter having at least one opening. The polarizing member includes a first polarizing unit and a second polarizing unit arranged so as to surround the first polarizing unit when viewed from the incident direction of the illumination light with respect to the polarizing member. The second polarizing unit is configured so as to polarize at least a part of the illumination light entering the second polarizing unit in the circumferential direction along the outer circumference of the first polarizing unit. At least a portion of the first polarizing unit is configured to polarize the illumination light in the direction orthogonal to the polarization direction in apart of the second polarizing unit located on the side opposite to the central part of the first polarizing unit when viewed from the portion. The openings are arranged in the filter so that the illumination light at the post stage of the filter and the polarizing member in the optical path of the illumination light includes the illumination light polarized by the first polarizing unit and the illumination light polarized by the second polarizing unit.

According to an exposure apparatus of an embodiment, it is possible to increase the resolution of patterns extending in various directions. Therefore, the exposure apparatus can expose patterns extending in various directions all together at a high degree of resolution without performing double patterning.

The above and other objects, features, aspects, and advantages of the invention will become apparent from the following detailed description related to the invention that can be understood in relation to the accompanying drawings.

BRIEF DESCRIPTION OF THE DRAWINGS

FIGS. 20A and 20B are diagrams each explaining an example of L and S patterns formed on a photomask;

DETAILED DESCRIPTION

Hereinafter, embodiments of the invention will be described in detail with reference to the drawings. In the following description, the same parts are followed by the same signs. The names and functions thereof are also the same. However, the detailed explanation thereof will not be repeated.

[Related Technique]

First, problems of an exposure apparatus according to a related technique will be described. Then, an exposure apparatus according to an embodiment that can solve the problems of the exposure apparatus according to the related technique will be described.

Figure 1:
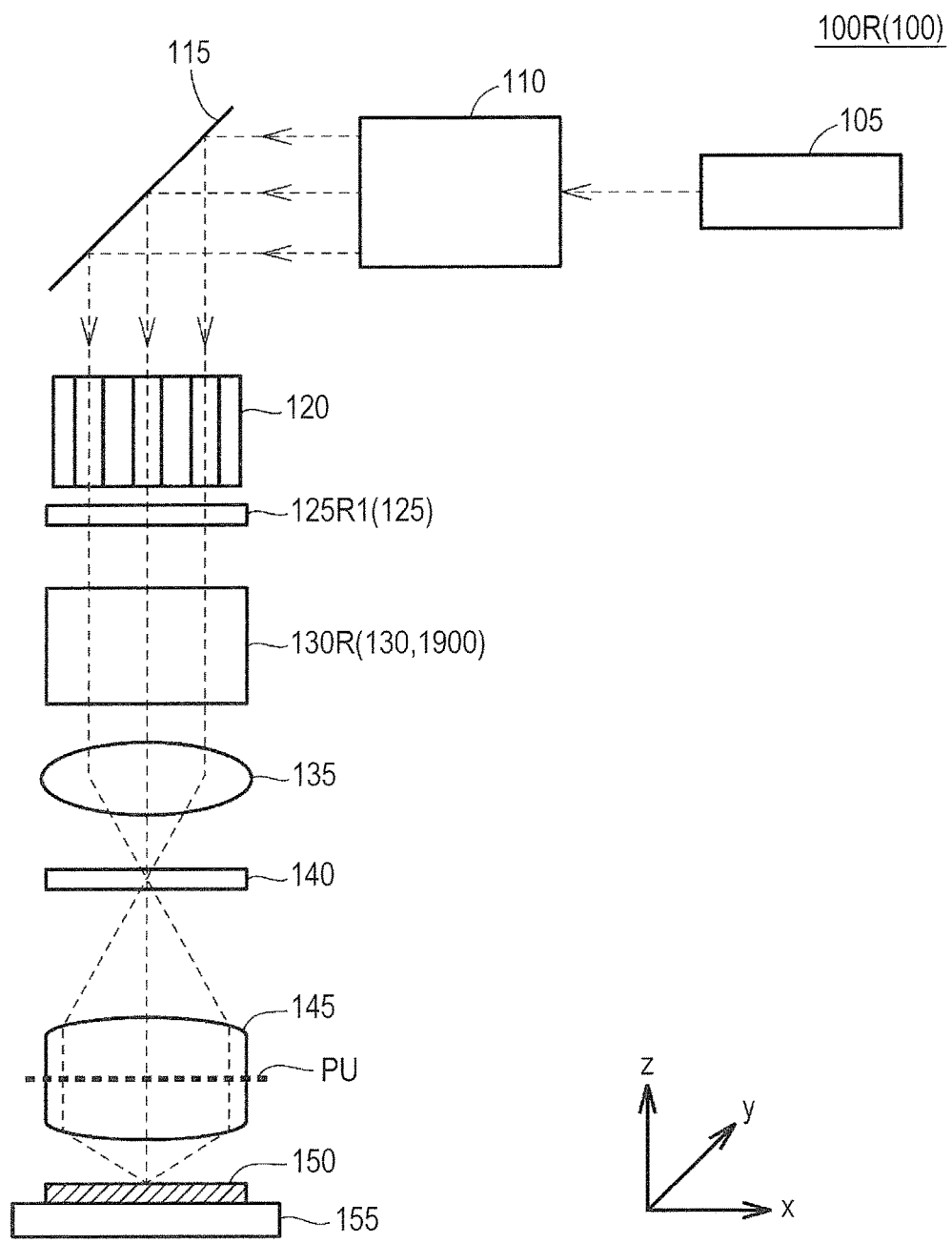
FIG. 1 is a diagram for explaining a configuration example of an exposure apparatus according to a related technique.

FIG. 1 is a diagram for explaining a configuration example of an exposure apparatus 100R according to the related technique. With reference to FIG. 1, the exposure apparatus 100R according to the related technique includes a light source 105, and further includes a zoom lens 110, a mirror 115, a microlens array 120, a polarizing member 125R1, a filter 130R, a condenser lens 135, a photomask 140, a projection optical system 145, and a stage 155 in the order of the optical path. On the stage 155, a wafer 150 is fixed.

The light source 105 is configured in such a manner that illumination light for exposure can be irradiated. As the light source 105, a pulse laser such as an ArF excimer laser having a wavelength of about 193 nm, a KrF excimer laser having a wavelength of about 248 nm, or an F2 excimer laser having a wavelength of about 157 nm can be used.

The illumination light irradiated from the light source 105 enters the mirror 115 for bending the optical path through the zoom lens 110 configured using a combination of a concave lens and a convex lens. The zoom lens 110 is configured in such a manner that the focal distance can be continuously changed within a predetermined range determined by a combination of the concave lens and the convex lens.

The illumination light with the optical path bent from the x-axis direction to the z-axis direction by the mirror 115 enters the microlens array 120. In the microlens array 120, a large number of minute lenses (minute refraction surfaces) are integrally formed without being isolated from each other. Accordingly, the microlens array 120 can function as an optical integrator (illuminance uniforming member). It should be noted that a fly-eye lens may be used instead of the microlens array 120 in another aspect. The illumination light through the microlens array 120 enters the polarizing member 125R1.

Figure 2:
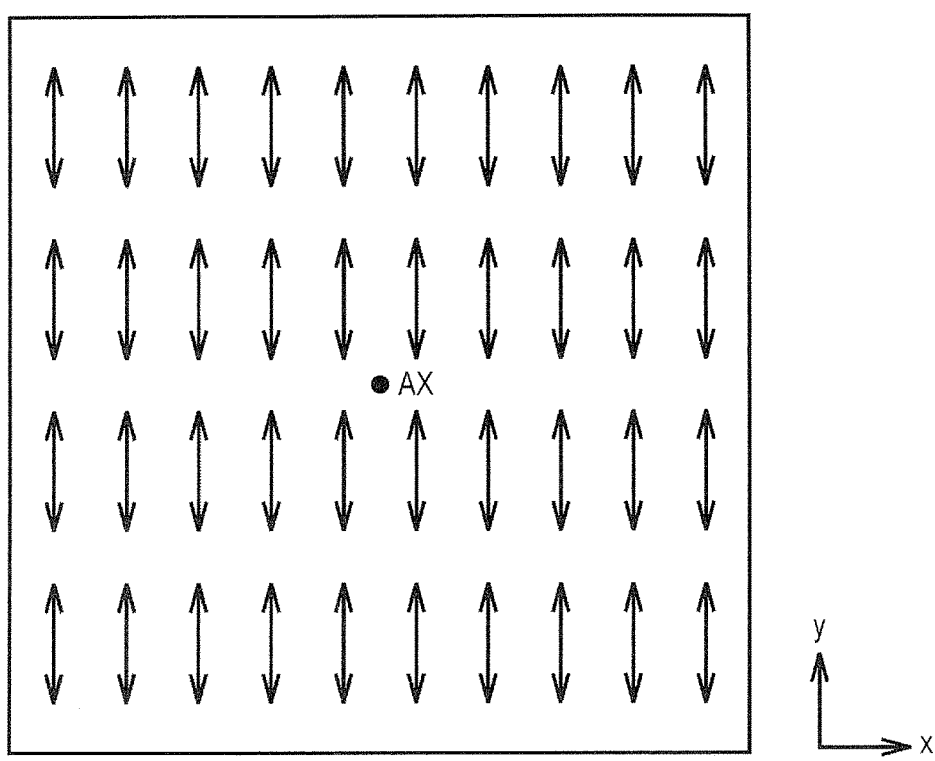
FIG. 2 is a diagram for explaining the polarization distribution of a polarizing member according to the related technique.

FIG. 2 is a diagram for explaining the polarization distribution of the polarizing member 125R1 according to the related technique. The polarizing member 125R1 is configured using a ½-wavelength plate having a uniform direction of the optical crystal axis, and has a function of aligning the polarization direction of the passing light to the y-direction. In a certain aspect, the polarizing member 125R1 is arranged so that the optical axis AX penetrates the center position of the polarizing member 125R1.

With reference to FIG. 1 again, the illumination light having passed through the polarizing member 125R1 enters the filter 130R.

Figure 3:
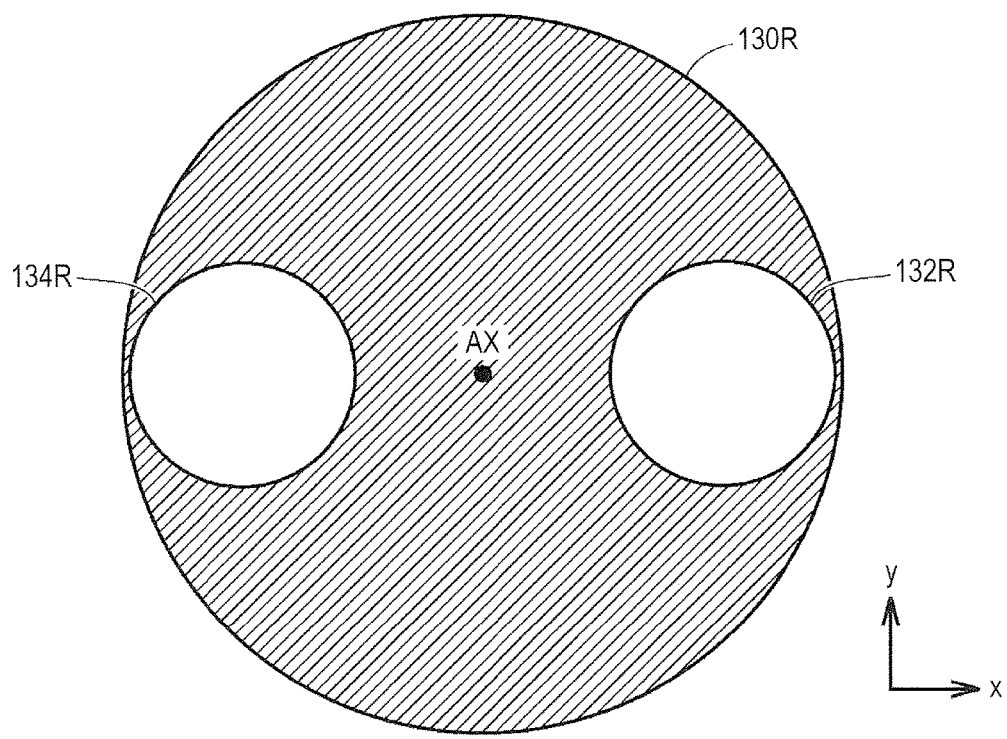
FIG. 3 is a diagram for explaining a configuration of a filter according to the related technique.

FIG. 3 is a diagram for explaining a configuration of the filter 130R according to the related technique. With reference to FIG. 3, the filter 130R is formed in a disk shape, and has openings 132R and 134R near the ends in the x-direction. Such a filter 130R is also referred to as dipole illumination. The filter 130R allows only the illumination light irradiated onto the openings 132R and 134R to pass through among those passing through the polarizing member 125R1. Therefore, the filter 130R can function as a diaphragm.

In a certain aspect, these optical members are arranged so that the optical axis AX of the light flux passing through the polarizing member 125R1 penetrates the center of the filter 130R. Accordingly, the illumination light from the openings 132R and 134R arranged at positions apart from the optical axis is condensed by the condenser lens 135, and then obliquely enters the photomask 140. A pattern for exposing a photoresist (photoreceptor layer) formed on the wafer 150 is formed on the photomask 140.

The light flux entering the photomask 140 is diffracted by the pattern formed on the photomask 140, and enters the projection optical system 145. The projection optical system 145 reduces the incident light flux, and irradiates the same onto the photoresist formed on the wafer 150.

Figure 4:
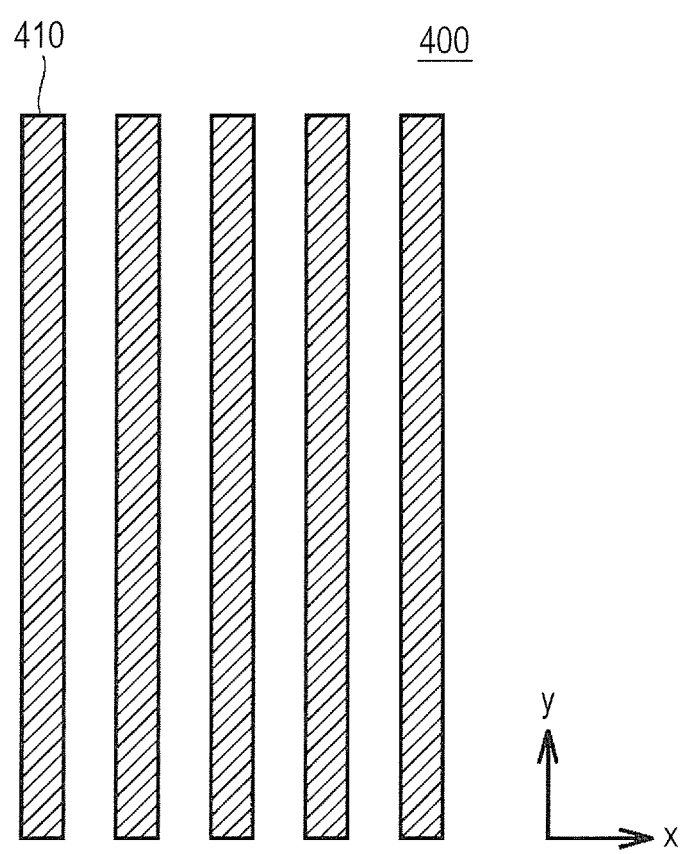
FIG. 4 is a diagram for explaining an example of a pattern formed on a photomask.

FIG. 4 is a diagram for explaining an example of the pattern formed on the photomask 140. With reference to FIG. 4, a line-and-space pattern (hereinafter, also referred to as "L and S pattern") 400 aligned at predetermined intervals in the x-direction is formed on the photomask 140 in a certain aspect. Each line 410 configuring the L and S pattern 400 extends in the y-direction.

Figure 5:
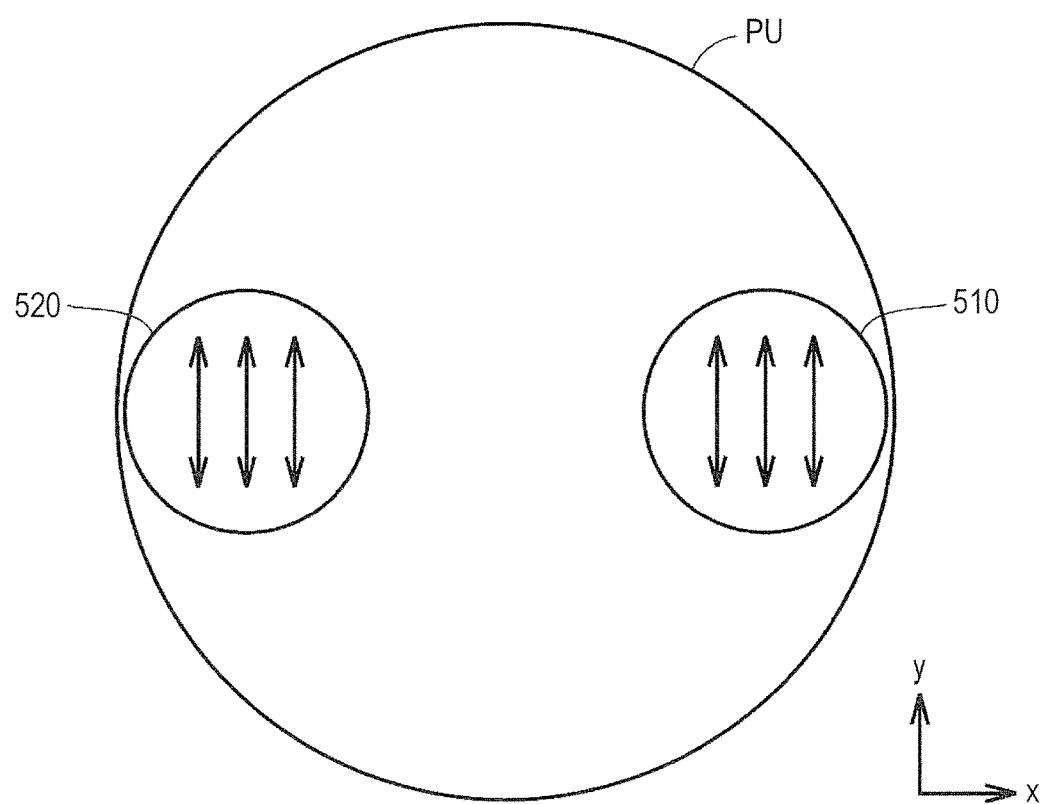
FIG. 5 is a diagram for explaining diffracted light distribution on a pupil surface of a projection optical system according to the related technique.

FIG. 5 is a diagram for explaining the diffracted light distribution on a pupil surface PU of the projection optical system 145 according to the related technique. In FIG. 5, the light flux from the opening 132R will be described as an example. The light flux having obliquely entered the L and S pattern 400 through the opening 132R is diffracted in the x-direction. Therefore, as shown in FIG. 5, zero-order diffracted light 510 and first-order diffracted light 520 of the light flux having passed through the opening 132R can enter the pupil surface PU. Accordingly, a pattern is imaged on the wafer 150 (the photoresist on the wafer 150) by two kinds of light flux of the zero-order diffracted light and the first-order diffracted light. As described above, the exposure apparatus 100R according to the related technique increases the light intensity on the wafer 150 by allowing the light to obliquely enter the photomask 140 through the filter 130R, so that the resolution can be increased. It should be noted that the light flux from the opening 134R behaves in the same way as that from the opening 132R. Thus, the explanation thereof will not be repeated.

Further, the zero-order diffracted light 510 and the first-order diffracted light 520 are linearly polarized light that oscillates in the y-direction by the action of the polarizing member 125R1. Therefore, the oscillation direction (polarization direction) of the zero-order diffracted light 510 and the oscillation direction of the first-order diffracted light 520 match each other on the imaging plane on the wafer 150, and these diffracted light beams interfere so as to intensify each other. Accordingly, the exposure apparatus 100R according to the related technique can increase the resolution by increasing the light intensity on the wafer.

Figure 6:
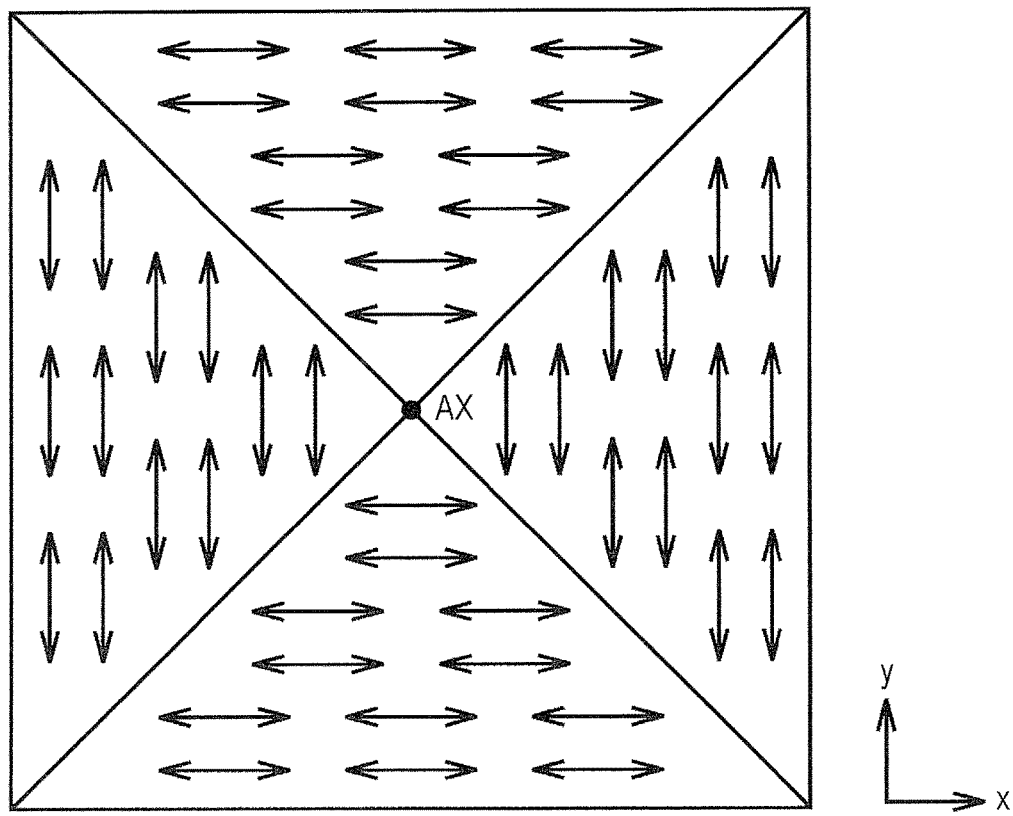
FIG. 6 is a diagram for explaining the polarization distribution of a polarizing member according to another related technique.

FIG. 6 is a diagram for explaining the polarization distribution of a polarizing member 125R2 according to another related technique. As shown in FIG. 6, the polarizing member 125R2 is rectangular in shape. In the polarizing member 125R2, the polarization distribution is formed in the circumferential direction around the optical axis AX as the center in four regions divided by two diagonal lines. More specifically, in the ½-wavelength plates configuring the regions that face each other in the x-direction among the four divided regions, the direction of the optical crystal axis is aligned so as to linearly polarize the passing light flux in the y-direction. On the other hand, in the ½-wavelength plates configuring the regions that face each other in the y-direction, the direction of the optical crystal axis is aligned so as to linearly polarize the passing light flux in the x-direction. Even in the case where such a polarizing member 125R2 is used in place of the polarizing member 125R1 described in FIG. 2, the light flux passing through the openings 132R and 134R is polarized in the y-direction. Therefore, even in the case where the polarizing member 125R2 shown in FIG. 6 is used in place of the polarizing member 125R1 described in FIG. 2, the same effect as in the case of the polarizing member 125R1 can be obtained in the exposure apparatus 100R according to the related technique.

Figure 7:
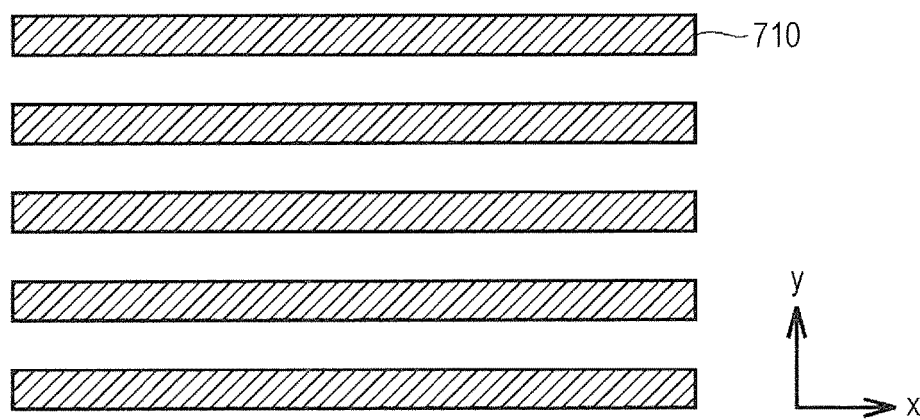
FIG. 7 is a diagram for explaining an example of another pattern formed on the photomask.

However, in the case where the L and S pattern 700 aligned at predetermined intervals in the y-direction as shown in FIG. 7 is exposed using a combination of the polarizing member 125R1 or 125R2 and the filter 130R, high resolution cannot be obtained.

FIG. 7 is a diagram for explaining an example of another pattern formed on the photomask 140. In another aspect, the L and S pattern 700 aligned at predetermined intervals in the y-direction is formed on the photomask 140. Each line 710 configuring the L and S pattern 700 extends in the x-direction.

The diffracted light distribution on the pupil surface PU of the projection optical system 145 differs according to the interval (space width) between the lines 710 of the line and space 700. A case in which the space width of the pattern is narrow and a case in which the space width of the pattern is wide when exposing the L and S pattern 700 using a combination of the polarizing member 125R1 and the filter 130R will be described.

Figure 8:
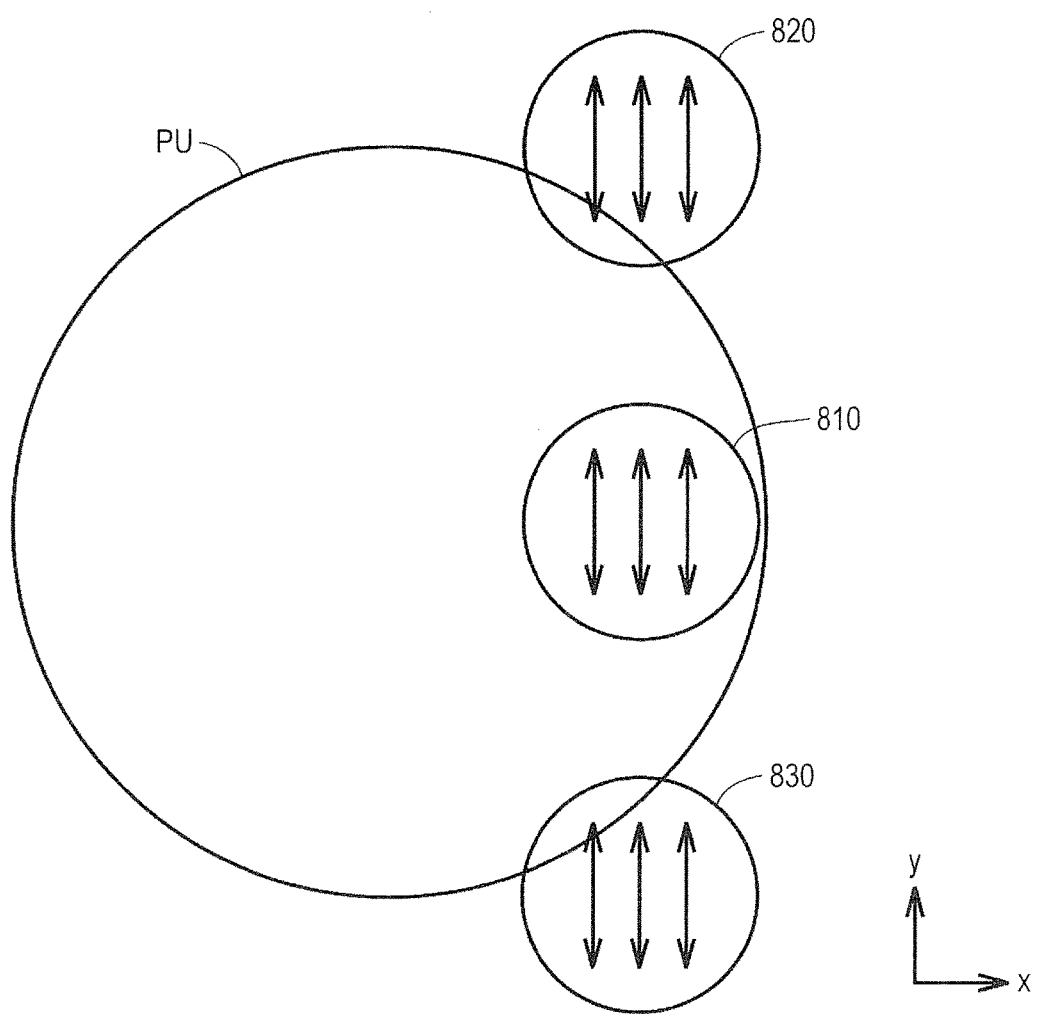
FIG. 8 is a diagram for explaining diffracted light distribution on the pupil surface of the projection optical system in the case where an L and S pattern with a narrow space width is used.

FIG. 8 is a diagram for explaining the diffracted light distribution on the pupil surface PU of the projection optical system 145 in the case where the L and S pattern 700 with a narrow space width is used. In FIG. 8, as an example, the diffracted light distribution of the light flux from the opening 132R will be described as similar to FIG. 5. Zero-order diffracted light 810 and first-order diffracted light 820 and 830 having passed through the L and S pattern 700 enter the pupil surface PU. As the space width in the L and S pattern 700 becomes narrower, the angle of the first-order diffracted light relative to the zero-order diffracted light is increased. Therefore, as shown in FIG. 8, most of the first-order diffracted light 820 and 830 do not enter the pupil surface PU. Thus, the first-order diffracted light 820 and 830 does not substantially contribute to imaging, and the light intensity on the wafer 150 is low. As a result, the resolution of the L and S pattern 700 on the wafer 150 cannot be increased.

Figure 9:
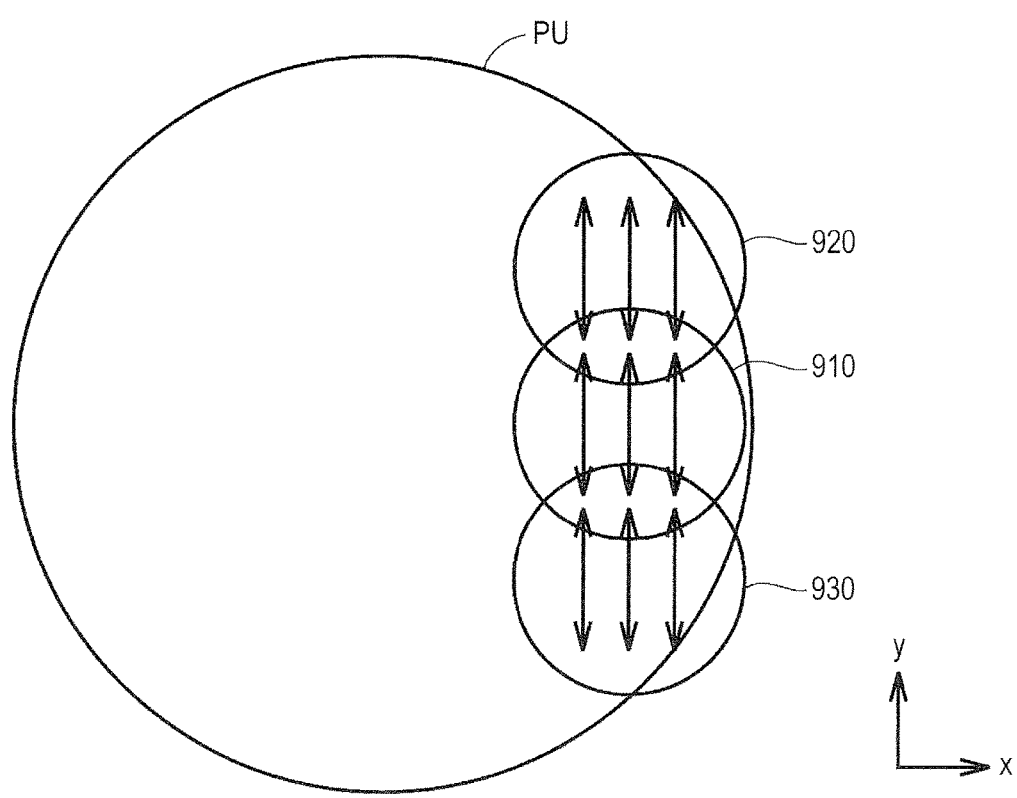
FIG. 9 is a diagram for explaining diffracted light distribution on the pupil surface of the projection optical system in the case where an L and S pattern with a wide space width is used.

FIG. 9 is a diagram for explaining the diffracted light distribution on the pupil surface PU of the projection optical system 145 in the case where the L and S pattern 700 with a wide space width is used. In FIG. 9, as an example, the diffracted light distribution of the light flux from the opening 132R will be described as similar to FIG. 5. Zero-order diffracted light 910 and first-order diffracted light 920 and 930 having passed through the L and S pattern 700 enter the pupil surface PU. As shown in FIG. 9, in the case where the space width in the L and S pattern 700 is wide, most of the first-order diffracted light enters the pupil surface PU because the angle of the first-order diffracted light relative to the zero-order diffracted light is small. However, since the oscillation direction of the zero-order diffracted light 910 and the oscillation direction of the first-order diffracted light 920 and 930 do not match each other on the imaging plane on the wafer 150, the light intensity on the wafer 150 is not increased by these diffracted light beams. As a result, the resolution of the L and S pattern 700 on the wafer 150 cannot be increased.

It should be noted that the examples shown in FIG. 8 and FIG. 9 are the same even in the case where the polarizing member 125R2 is used in place of the polarizing member 125R1.

As described above, the exposure apparatus 100R according to the related technique can increase the resolution of the L and S pattern 400 (repetition of the pattern extending in the y-direction) aligned in the x-direction, but cannot increase the resolution of the L and S pattern 700 aligned in the y-direction.

Figure 10B:
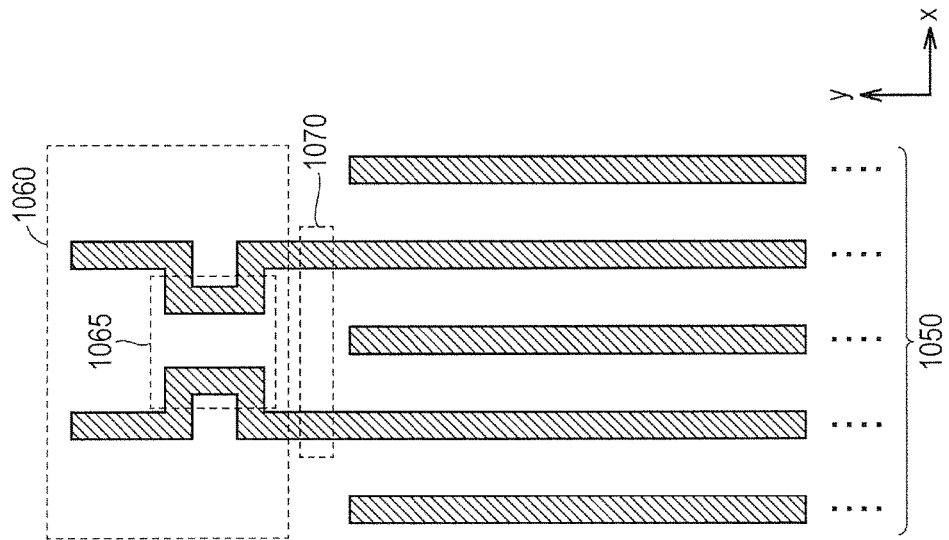
FIGS. 10A and 10B are diagrams each explaining a schematic circuit configuration configuring a memory array and a peripheral device.
Figure 10A:
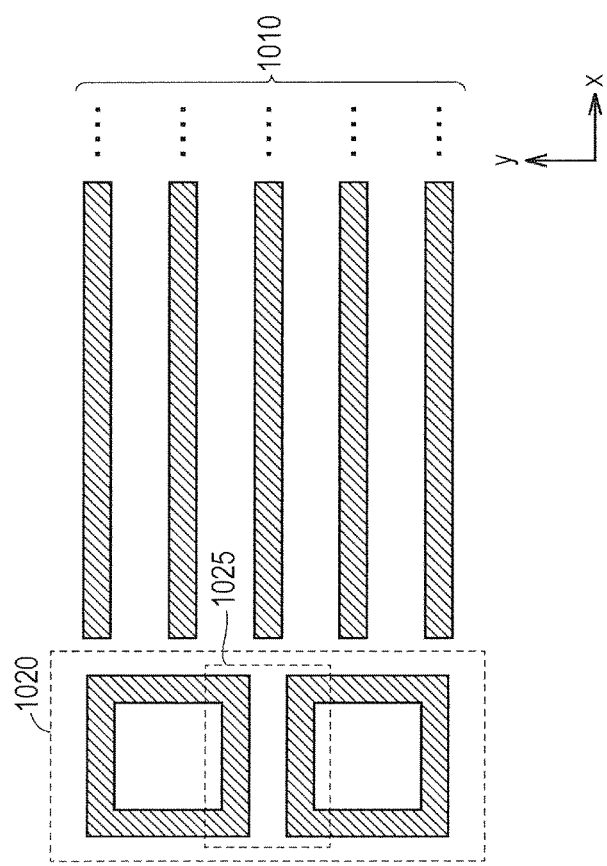

FIGS. 10A and 10B are diagrams each explaining a schematic circuit configuration configuring a memory array and a peripheral device. FIG. 10A is a diagram for explaining a metal line layer in a certain layer. FIG. 10B is a diagram for explaining a metal line layer in another layer.

In the layer shown in FIG. 10A, metal lines 1010 as word lines extend in the x-direction. In addition, metal lines 1020 as peripheral devices (a row decoder and the like) are formed. The metal lines 1010 form the L and S pattern aligned at predetermined intervals in the y-direction. The metal lines 1020 include metal lines extending in the y-direction in addition to metal lines extending in the x-direction. Further, an interval (space width) between the metal lines is narrow in a region 1025, and the metal lines formed in the region are required to have high resolution.

In the layer shown in FIG. 10B, metal lines 1050 as bit lines extend in the y-direction. In addition, metal lines 1060 as peripheral devices (a multiplexer and the like) are formed. The metal lines 1050 form the L and S pattern aligned at predetermined intervals in the x-direction. The metal lines 1060 include metal lines extending in the x-direction in addition to metal lines extending in the y-direction. Further, an interval (space width) between the metal lines is narrow in a region 1065 and a region 1070 that is a connection part between the peripheral devices and a memory array unit, and the metal lines formed in the regions are required to have high resolution.

As described above, the exposure apparatus 100R according to the related technique can increase the resolution of the pattern extending in a predetermined direction, but cannot increase the resolution of the pattern extending in the direction orthogonal to the predetermined direction. Therefore, in the case where the pattern shown in FIG. 10A or 10B is exposed using the exposure apparatus 100R according to the related technique, there is a possibility that the resolution of the pattern extending in the y-direction in the metal lines 1020 and the resolution of the pattern extending in the x-direction in the metal lines 1060 become low. Therefore, there may be a case in which the exposure apparatus 100R cannot satisfy the resolution required in the regions 1025, 1065, and 1070 where high resolution is required. In this case, the exposure apparatus 100R needs to perform double patterning in order to expose the patterns shown in FIG. 10A and/or FIG. 10B. In the case of performing the double patterning, high resolution can be realized, but there are problems such as an increase in the manufacturing cost of a product to be exposed by the exposure apparatus and a reduction in the production efficiency. Accordingly, a configuration of an exposure apparatus according to an embodiment that can solve these problems will be described below.

First Embodiment

With reference to FIG. 1 again, an exposure apparatus 100 according to an embodiment is different from the exposure apparatus 100R according to the related technique in that a polarizing member 125 is provided instead of the polarizing member 125R1 and a filter 130 is provided instead of the filter 130R. The other parts are the same, and thus the explanation thereof will not be repeated. It should be noted that the exposure apparatus 100 may be configured to fill a space between the projection optical system 145 and the wafer 150 with a medium (for example, a pure medium with a refractive index of 1.44) in another aspect. Further, the exposure apparatus 100 may be a batch exposure-type apparatus such as a stepper or a scanning exposure-type apparatus such as a scanner.

(Configuration of Polarizing Member 125)

Figure 11:
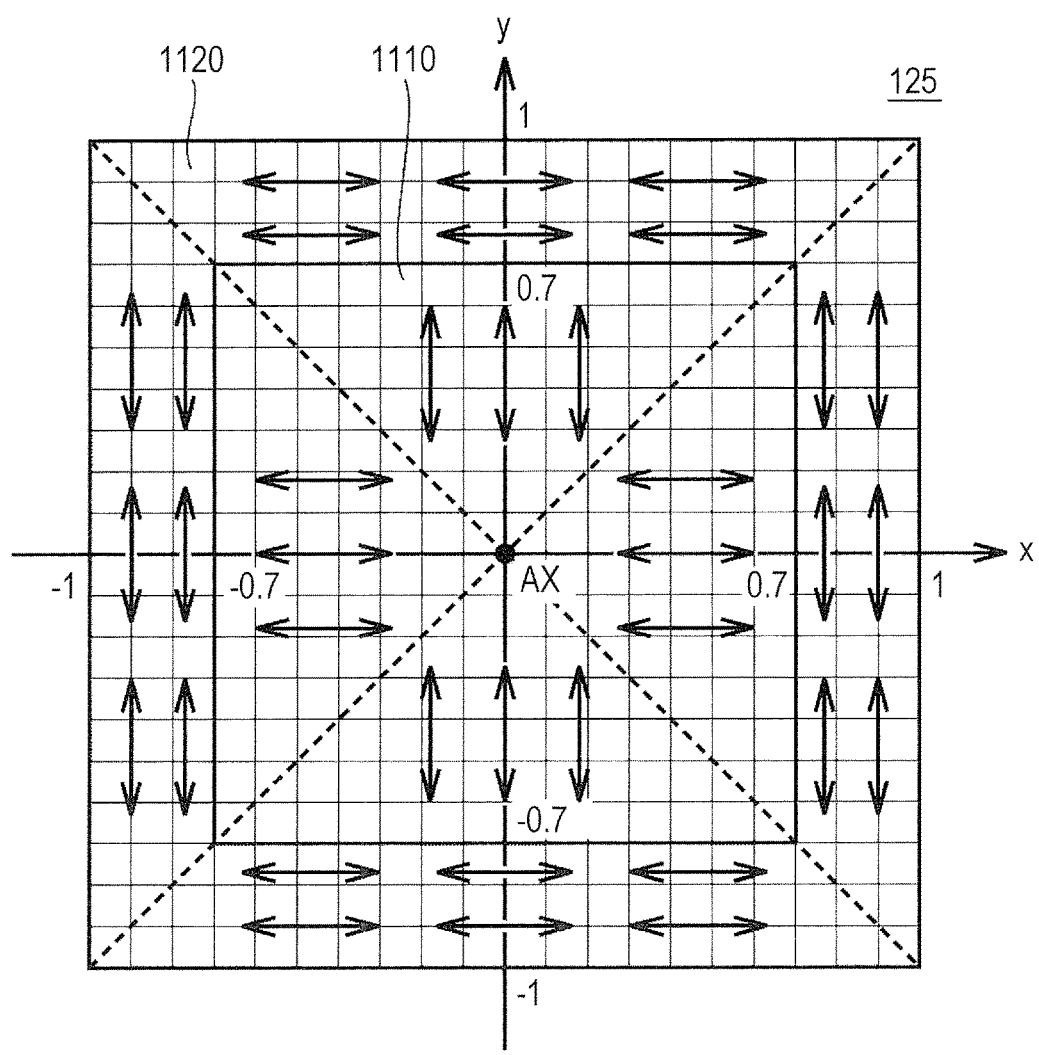
FIG. 11 is a diagram for explaining the polarization distribution of a polarizing member according to an embodiment.

FIG. 11 is a diagram for explaining the polarization distribution of the polarizing member 125 according to an embodiment. With reference to FIG. 11, the polarizing member 125 includes a polarizing unit 1110 and a polarizing unit 1120 outside the polarizing unit 1110. The polarizing unit 1120 is arranged so as to surround the polarizing unit 1110 when viewed from the incident direction of the illumination light with respect to the polarizing member 125. In a certain aspect, the polarizing unit 1110 and the polarizing unit 1120 are integrally formed. In the example shown in FIG. 11, the polarizing member 125 is rectangular in shape, and the polarizing units 1110 and 1120 configuring the polarizing member 125 are also rectangular in shape. The shape of each of the polarizing units 1110 and 1120 is not limited to a rectangular shape, but may be, for example, a circular shape. Further, the polarizing member 125 may be configured using three or more polarizing units in another aspect.

In a certain aspect, the polarizing units 1110 and 1120 are configured using ½-wavelength plates. In the ½-wavelength plate configuring the polarizing unit 1120, the direction of the optical crystal axis is aligned so as to linearly and circumferentially polarize the passing light flux along the circumference of the polarizing unit 1110. In the example shown in FIG. 11, the polarizing unit 1120 circumferentially forms polarization distribution around the optical axis AX as the center in four regions divided by two diagonal lines. In the ½-wavelength plate configuring the regions facing each other in the x-direction among the four divided regions, the direction of the optical crystal axis is aligned so as to linearly polarize the passing light flux in the y-direction. On the other hand, in the ½-wavelength plate configuring the regions facing each other in the y-direction, the direction of the optical crystal axis is aligned so as to linearly polarize the passing light flux in the x-direction.

In, at least, a certain area of the ½-wavelength plate configuring the polarizing unit 1110, the direction of the optical crystal axis is aligned so as to polarize the illumination light in the direction orthogonal to the polarization direction in a part of the polarizing unit 1120 located on the side opposite to the central part of the polarizing unit 1110 when viewed from the certain area. In the example shown in FIG. 11, the polarizing unit 1110 has four regions divided by two diagonal lines. In the ½-wavelength plate configuring the regions facing each other in the x-direction among the four divided regions, the direction of the optical crystal axis is aligned so as to linearly polarize the passing light flux in the x-direction. On the other hand, in the ½-wavelength plate configuring the regions facing each other in the y-direction, the direction of the optical crystal axis is aligned so as to linearly polarize the passing light flux in the y-direction.

In the example shown in FIG. 11, in the case where the distance from the optical axis AX to the outer peripheral end of the polarizing unit 1120 is 1, the position of the boundary line between the polarizing units 1110 and 1120 is set to 0.7. It should be noted that the position of the boundary line between the polarizing units 1110 and 1120 may be set to 0.6 to 0.8 in another aspect.

(Configuration of Filter 130)

Figure 12:
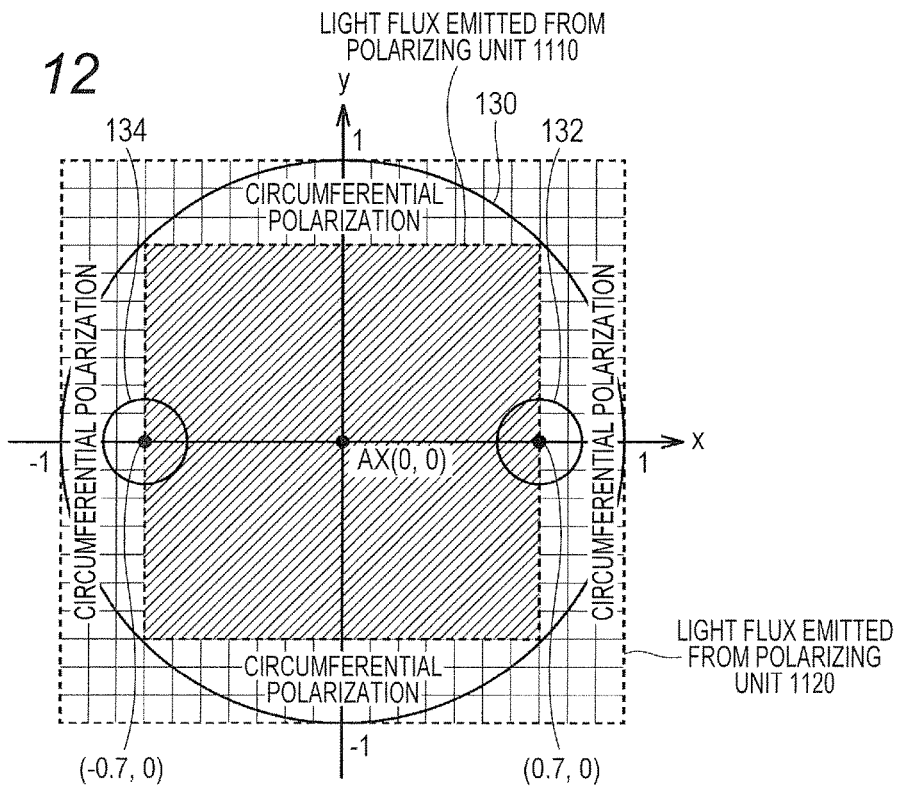
FIG. 12 is a diagram for explaining a configuration of a filter according to an embodiment.

FIG. 12 is a diagram for explaining a configuration of a filter 130 according to an embodiment. With reference to FIG. 12, the filter 130 has openings 132 and 134 near the ends in the x-direction. In the example shown in FIG. 12, each of the filter 130, the opening 132, and the opening 134 is circular in shape. It should be noted that the shape of each of the filter 130, the opening 132, and the opening 134 is not limited to a circular shape, but may be, for example, a rectangular shape.

In FIG. 12, the grid represents the light flux emitted from the polarizing member 125. In a certain aspect, the circular filter 130 can be arranged in such a manner that the light flux emitted from the polarizing member 125 (polarizing unit 1120) comes into contact with each side of a rectangle produced in the x-y plane.

In a certain aspect, the centroid positions of the openings 132 and 134 in the x-y plane can be arranged at the boundary positions between the light flux entering from the polarizing unit 1110 and the light flux entering from the polarizing unit 1120. In this case, when the distance from the position of the optical axis AX to the outer peripheral end of the filter 130 is 1 and the position of the optical axis AX is the origin (0, 0) in the x-y plane, the centroid position of the opening 132 can be set to (0.7, 0), and the centroid position of the opening 134 can be set to (−0.7, 0). In such a case, the light flux emitted from the openings 132 and 134 includes the light flux polarized by the polarizing unit 1110 and the light flux changed by the polarizing unit 1120. More specifically, the light flux emitted from the right half (a part where the coordinate position in the x-direction is 0.7 or larger) of the opening 132 has linear polarization in the y-direction by the polarizing unit 1120, and the light flux emitted from the left half (a part where the coordinate position in the x-direction is smaller than 0.7) has linear polarization in the x-direction by the polarizing unit 1110. The light flux emitted from the left half (a part where the coordinate position in the x-direction is smaller than −0.7) of the opening 134 has linear polarization in the y-direction by the polarizing unit 1120, and the light flux emitted from the left half (a part where the coordinate position in the x-direction is −0.7 or larger) has linear polarization in the x-direction by the polarizing unit 1110.

It should be noted that the filter 130 may be arranged at the preceding stage of the polarizing member 125 in the optical path in another aspect. The openings in the filter 130 may be arranged in such a manner that the light flux (illumination light) at the post stage of the polarizing member 125 and the filter 130 includes the light flux polarized by the polarizing unit 1110 and the light flux polarized by the polarizing unit 1120.

(Diffracted Light Distribution on Pupil Surface PU)

Figure 13:
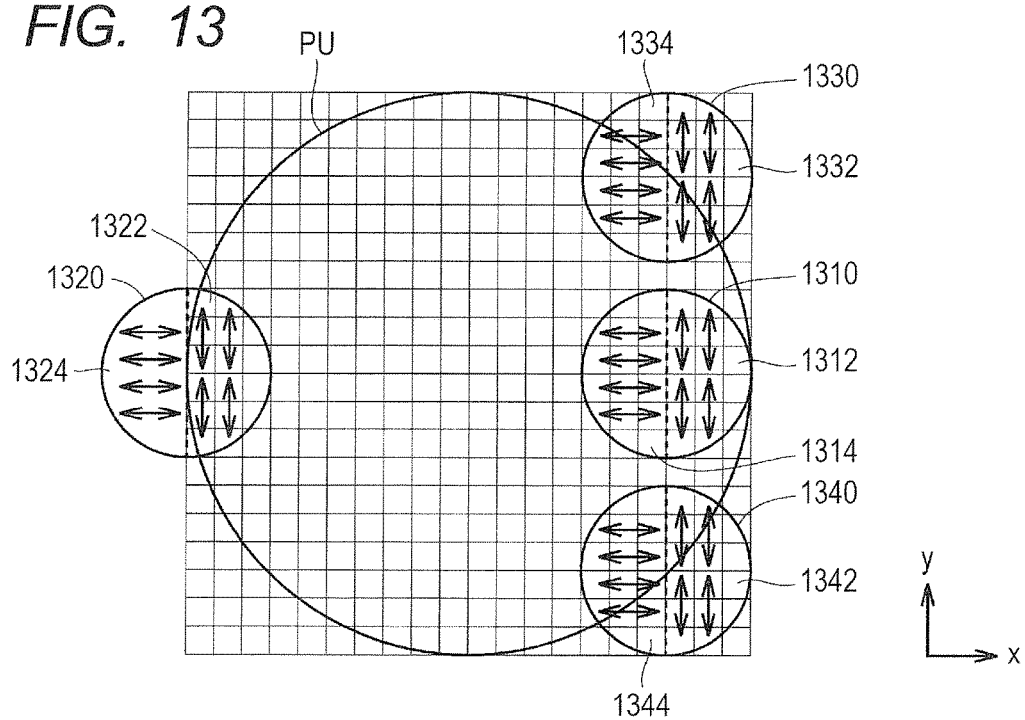
FIG. 13 is a diagram for explaining diffracted light distribution on a pupil surface of a projection optical system of an exposure apparatus according to an embodiment.

FIG. 13 is a diagram for explaining diffracted light distribution on the pupil surface PU of the projection optical system 145 of the exposure apparatus 100 according to an embodiment. FIG. 13 shows diffracted light distribution on the pupil surface PU in the case where the L and S pattern 400 and the L and S pattern 700 are exposed using the polarizing member 125 and the filter 130. It should be noted that, for the sake of simplification of the explanation, FIG. 13 shows the diffracted light distribution of the light flux emitted from the opening 132.

In the case where the L and S pattern 400 aligned in the x-direction is formed on the photomask 140, zero-order diffracted light 1310 and first-order diffracted light 1320 enter the pupil surface PU. As described above, the right halves (light in regions 1312 and 1322) of the zero-order diffracted light 1310 and the first-order diffracted light 1320 have linear polarization in the y-direction, and the left halves (light in regions 1314 and 1324) have linear polarization in the x-direction.

The zero-order diffracted light and the first-order diffracted light diffracted by the L and S pattern 400 aligned in the x-direction travel on the x-z plane, and interfere with the imaging plane on the wafer 150. In this case, the light flux (light in the region 1312) of the zero-order diffracted light having linear polarization in the y-direction and the light flux (light in the region 1322) of the first-order diffracted light having linear polarization in the y-direction interfere so as to intensify each other on the imaging plane on the wafer 150. On the other hand, the light flux (light in the region 1314) of the zero-order diffracted light having linear polarization in the x-direction and the light flux (light in the region 1324) of the first-order diffracted light having linear polarization in the x-direction interfere so as to cancel each other because the oscillation directions thereof do not match each other on the imaging plane on the wafer 150. Therefore, in the example shown in FIG. 13, the optical system (for example, the projection optical system 145) configuring the exposure apparatus 100 is arranged so that the light flux of the first-order diffracted light 1320 having linear polarization in the x-direction does not enter the pupil surface PU. In other words, the optical system configuring the exposure apparatus 100 is arranged so that only the light flux of the first-order diffracted light 1320 substantially having linear polarization in the y-direction enters the pupil surface PU. Accordingly, the exposure apparatus 100 according to an embodiment can increase the resolution of the L and S pattern 400 aligned in the x-direction because the zero-order diffracted light 1310 and the first-order diffracted light 1320 interfere so as to intensify each other.

Next, a case in which the L and S pattern 700 aligned in the y-direction is formed on the photomask 140 will be described. In this case, the zero-order diffracted light 1310 and the first-order diffracted light 1330 and 1340 enter the pupil surface PU. The right halves (light in regions 1332 and 1342) of the first-order diffracted light 1330 and 1340 have linear polarization in the y-direction, and the left halves (light in regions 1334 and 1344) have linear polarization in the x-direction.

The zero-order diffracted light and the first-order diffracted light diffracted by the L and S pattern 700 aligned in the y-direction travel on the y-z plane, and interfere with the imaging plane on the wafer 150. In this case, the light flux (light in the region 1314) of the zero-order diffracted light having linear polarization in the x-direction and the light flux (light in the regions 1334 and 1344) of the first-order diffracted light having linear polarization in the x-direction interfere so as to intensify each other on the imaging plane on the wafer 150. On the other hand, the light flux (light in the region 1312) of the zero-order diffracted light having linear polarization in the y-direction and the light flux (light in the regions 1332 and 1342) of the first-order diffracted light having linear polarization in the y-direction interfere so as to cancel each other because the oscillation directions thereof do not match each other on the imaging plane on the wafer 150. However, as shown in FIG. 13, most of the light flux (light in the regions 1332 and 1342) of the first-order diffracted light 1330 and 1340 having linear polarization in the y-direction do not enter the pupil surface PU. Accordingly, the exposure apparatus 100 according to an embodiment can increase the resolution of the L and S pattern 700 aligned in the y-direction because the zero-order diffracted light 1310 and the first-order diffracted light 1330 and 1340 interfere so as to intensify each other.

According to the above, the exposure apparatus 100 according to an embodiment can increase the resolution of both the pattern (for example, a line 710) extending in the x-direction and the pattern (for example, a line 410) extending in the y-direction. Therefore, the exposure apparatus 100 can increase the resolution of the patterns extending in various directions. As a result, the exposure apparatus 100 can increase the resolution of the pattern including the L and S pattern extending in a predetermined direction and the line extending in the direction orthogonal to the predetermined direction as shown in FIGS. 10A and 10B without using double patterning.

It should be noted that the positions of the openings 132 and 134 (dipole) in the filter 130 are not limited to the example shown in FIG. 12. The openings 132 and 134 may be arranged so that the light flux polarized by the polarizing unit 1110 and the light flux polarized by the polarizing unit 1120 can enter. Namely, the openings 132 and 134 may be arranged so as to include the boundary position between the light flux entering from the polarizing unit 1110 and the light flux entering from the polarizing unit 1120.

Figure 14:
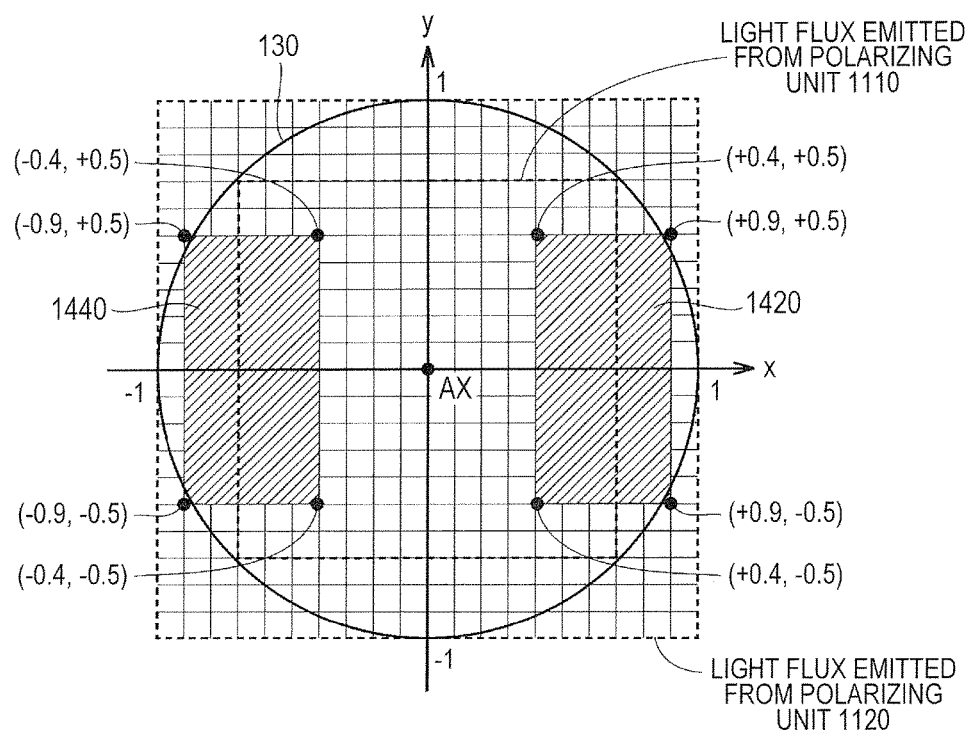
FIG. 14 is a diagram for explaining the arrangement positions of openings (dipole) in a filter according to an embodiment.

FIG. 14 is a diagram for explaining the arrangement positions of the openings (dipole) in the filter according to an embodiment. With reference to FIG. 14, in a certain aspect, the openings 132 and 134 can be arranged in a region 1420 and a region 1440, respectively. In this case, it should be noted that the openings 132 and 134 are arranged so as to include the boundary position between the light flux entering from the polarizing unit 1110 and the light flux entering from the polarizing unit 1120.

In the case where the optical axis AX is the origin and the distance from the end of the light flux emitted from the polarizing member 125 (polarizing unit 1120) to the optical axis AX is 1, the region 1420 includes a region of 0.4 to 0.9 in the x-direction and −0.5 to 0.5 in the y-direction. On the other hand, the region 1430 includes a region of −0.4 to −0.9 in the x-direction and −0.5 to 0.5 in the y-direction.

In this case, the centroid positions of the openings 132 and 134 may be arranged at the boundary position between the light flux entering from the polarizing unit 1110 and the light flux entering from the polarizing unit 1120, or may be arranged at a position deviated from the boundary position. Further, the centroid position of the opening 132 and the centroid position of the opening 134 may be arranged symmetrically about the optical axis AX.

As described above, the exposure apparatus 100 using the filter 130 in which the openings 132 and 134 are arranged can increase the resolution of the patterns extending in various directions.

(Comparison with Related Technique)

Hereinafter, a simulation result obtained by comparing the resolution of the exposure apparatus 100 according to the embodiment with the resolution of the exposure apparatus 100R according to the related technique will be described using FIG. 15 to FIG. 18. In each of FIG. 15 to FIG. 17, the boundary line between the polarizing units 1110 and 1120 is different.

Figure 15:
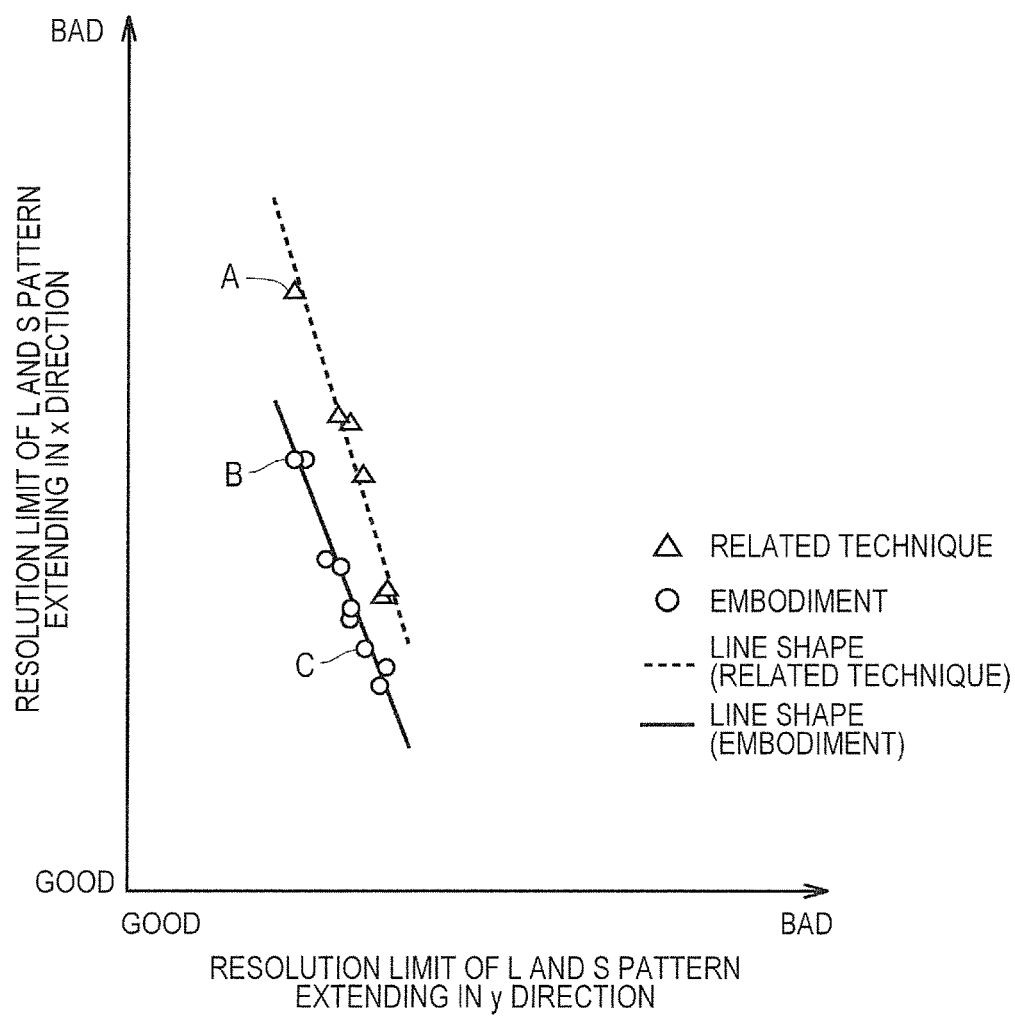
FIG. 15 is a diagram for explaining a simulation result in the case where the boundary position between polarizing units 1110 and 1120 is 0.7.

FIG. 15 is a diagram for explaining a simulation result in the case where the boundary position between the polarizing units 1110 and 1120 is 0.7. It should be noted that 0.7 is a value when the distance from the optical axis AX to the outer peripheral end of the polarizing unit 1120 is 1. This condition is the same in FIG. 16 to FIG. 18.

In FIG. 15, "○" represents the resolution of the exposure apparatus 100 according to the embodiment, and "△" represents the resolution of the exposure apparatus 100R according to the related technique. Further, in FIG. 15, the vertical axis represents the resolution limit of the L and S pattern 700 extending in the x-direction, and the horizontal axis represents the resolution limit of the L and S pattern 400 extending in the y-direction. It should be noted that the threshold value of the resolution is set when the image log-slope is 20 or larger. In FIG. 15, the data point closer to the lower left of the graph indicates that the resolution of both the pattern extending in the x-direction and the pattern extending in the y-direction is higher.

With reference to FIG. 15, even in the case where the centroid positions of the openings 132 and 134 are set at various positions, it can be understood that the exposure apparatus 100 according to the embodiment is superior to the exposure apparatus 100R according to the related technique in the resolution of both the pattern extending in the x-direction and the pattern extending in the y-direction. It should be noted that data points A, B, and C will be described in detail using FIG. 18.

Figure 16:
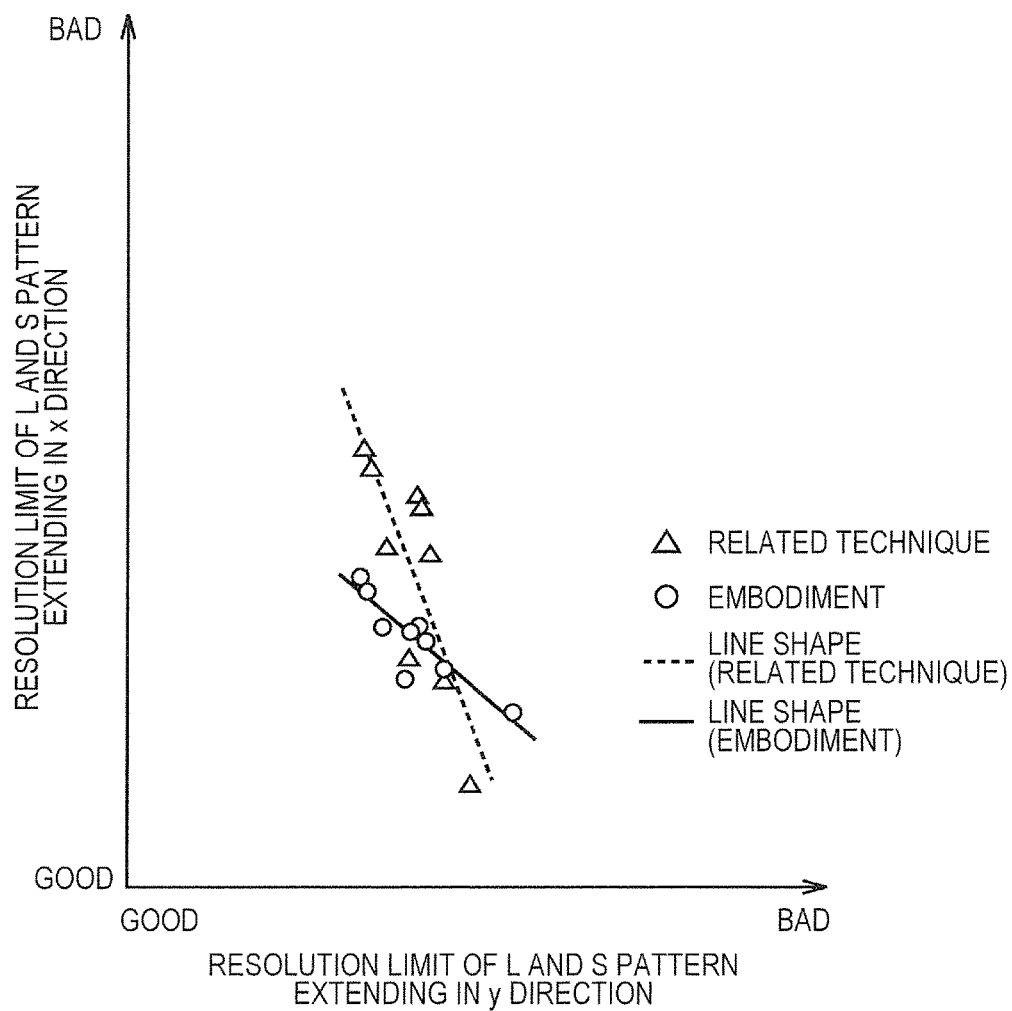
FIG. 16 is a diagram for explaining a simulation result in the case where the boundary position between the polarizing units 1110 and 1120 is 0.55.

FIG. 16 is a diagram for explaining a simulation result in the case where the boundary position between the polarizing units 1110 and 1120 is 0.55. With reference to FIG. 16, it can be understood that the exposure apparatus 100 according to the embodiment is higher than the exposure apparatus 100R according to the related technique in the resolution of the pattern depending on the centroid positions of the openings 132 and 134.

Figure 17:
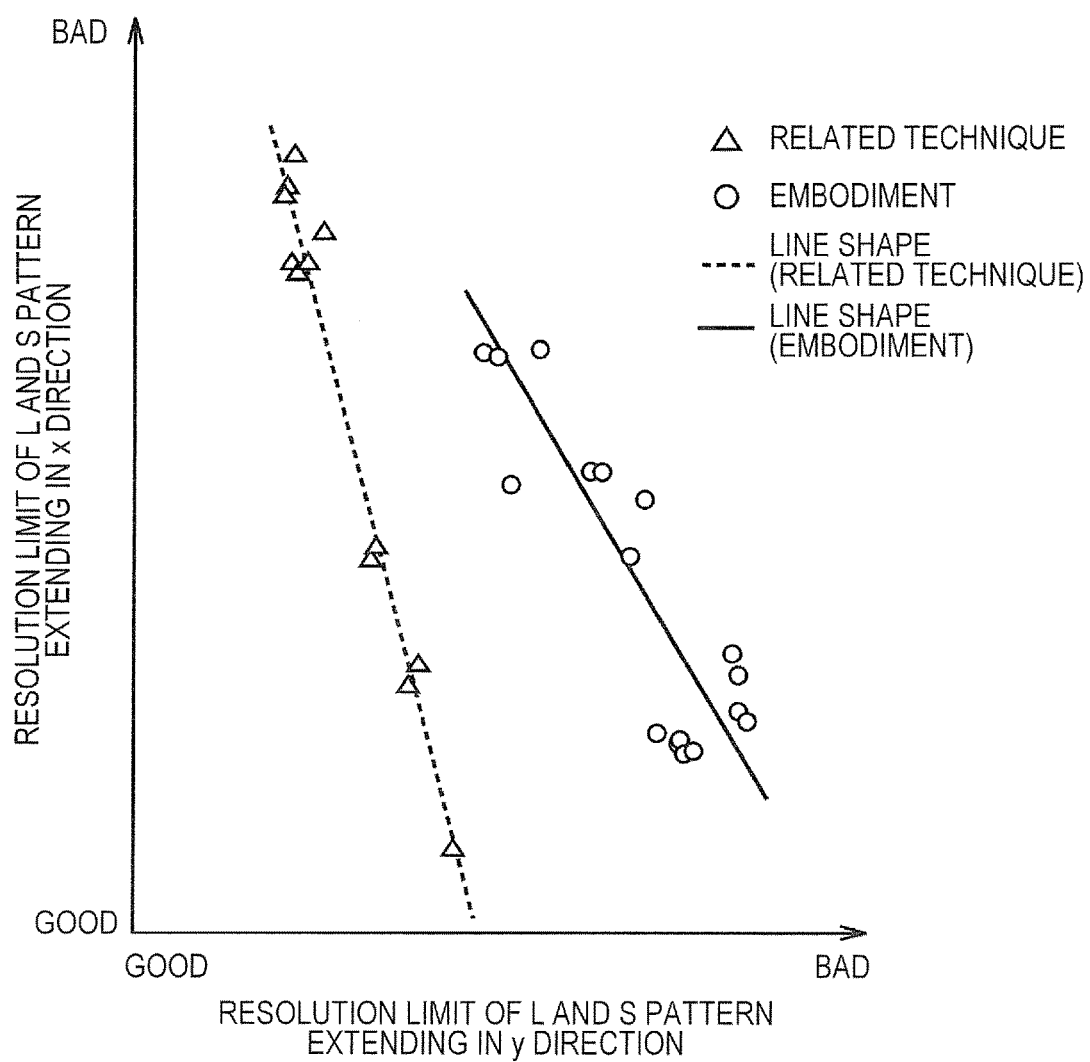
FIG. 17 is a diagram for explaining a simulation result in the case where the boundary position between the polarizing units 1110 and 1120 is 0.85.

FIG. 17 is a diagram for explaining a simulation result in the case where the boundary position between the polarizing units 1110 and 1120 is 0.85. In this case, it can be understood that the exposure apparatus 100R according to the related technique is higher than the exposure apparatus 100 according to the embodiment in the resolution of the pattern extending in the y-direction.

As shown in FIG. 15 to FIG. 17, the boundary position between the polarizing units 1110 and 1120 is desirably the position of 0.6 to 0.8.

Figures 18, 19:
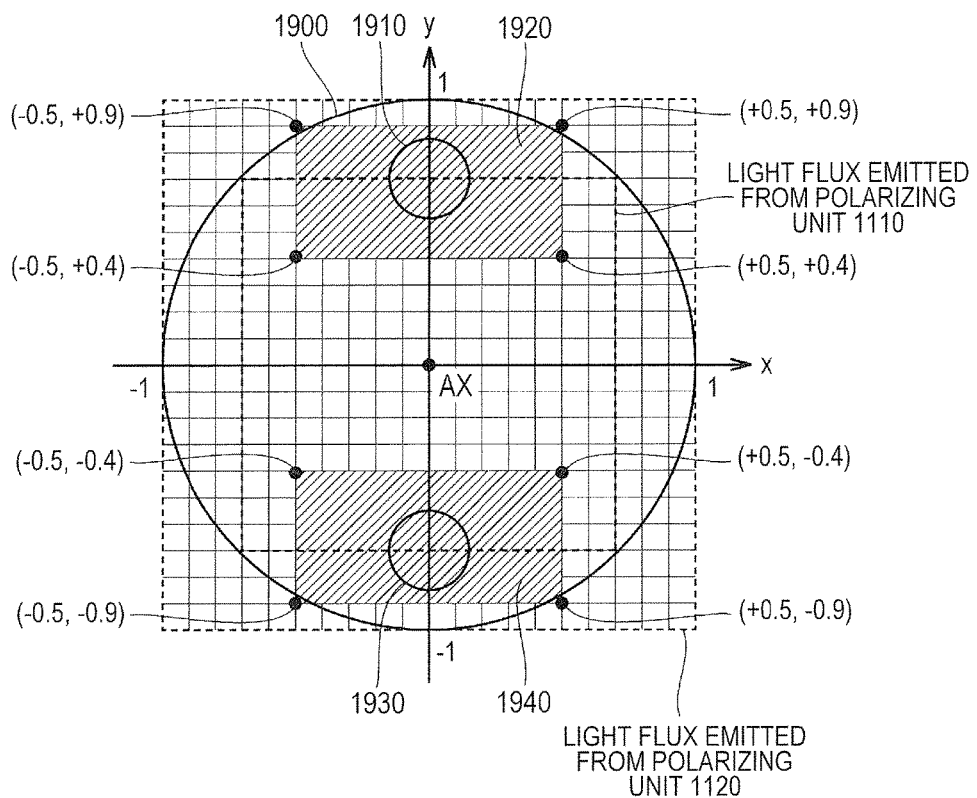
FIG. 18 is a diagram for individually explaining simulation results of data points A, B, and C in FIG. 15.
FIG. 19 is a diagram for explaining the arrangement positions of openings (dipole) in a filter 1900 according to an embodiment.

FIG. 18 is a diagram for individually explaining the simulation results of the data points A, B, and C in FIG. 15. The data point A indicates the simulation result in the case where the centroid position of the opening 132R is (0.7, 0) and the centroid position of the opening 134R is (−0.7, 0) in the exposure apparatus 100R according to the related technique. The data point B indicates the simulation result in the case where the centroid position of the opening 132 is (0.7, 0) and the centroid position of the opening 134 is (−0.7, 0) in the exposure apparatus 100 according to the embodiment. The data point C indicates the simulation result in the case where the centroid position of the opening 132 is (0.6, 0.3) and the centroid position of the opening 134 is (−0.6, −0.3) in the exposure apparatus 100 according to the embodiment. It should be noted that each coordinate is a coordinate in which the distance from the position of the optical axis AX to the outer peripheral end of the filter 130 is 1 and the position of the optical axis AX is the origin (0, 0) in the x-y plane. Further, each of the simulation results shown in FIG. 18 is a result when the diameter distance of the opening is 0.3.

As shown in FIG. 18, the resolution limit of the L and S pattern 400 extending in the y-direction at the data point B according to the embodiment is high (excellent) as similar to the data point A (related technique). Further, the resolution limit of the L and S pattern 700 extending in the x-direction at the data point B is significantly higher than the data point A.

Further, the resolution limit of the L and S pattern 400 extending in the y-direction at the data point C is slightly lower than the data point B, but the resolution limit of the L and S pattern 700 extending in the x-direction is significantly higher than the data point B. As being apparent from these simulation results, even in the case where the centroid position of the opening (dipole illumination) is not arranged at the boundary position between the light flux entering from the polarizing unit 1110 and the light flux entering from the polarizing unit 1120, the exposure apparatus can increase the resolution of the patterns extending in various directions. Further, the data point C indicates a result in which the light flux enters the L and S pattern 400 (the L and S pattern aligned in the x-direction) extending in the y-direction not from the x-direction but from the directions inclined by ±26 degrees with respect to the x-direction. From this fact, even in the case where the light flux enters the L and S pattern aligned in a predetermined direction from the directions inclined by about ±30 degrees with respect to the predetermined direction, the exposure apparatus according to the embodiment can increase the resolution of the patterns extending in various directions.

Second Embodiment

In the results shown in FIG. 15 to FIG. 18, the resolution limit of the pattern extending in the y-direction is higher than that of the pattern extending in the x-direction. However, the result is changed depending on the arrangement positions of the openings (dipole illumination). In the embodiment, the arrangement positions of the openings according to the pattern formed on the photomask 140 will be described.

The openings shown in FIG. 12 and FIG. 14 are configured to be arranged near the ends of the filter 130 in the x-direction. Therefore, as shown in FIG. 13, the interval between the incident position, on the pupil surface PU, of the first-order diffracted light diffracted by the L and S pattern extending in the y-direction and the incident position, on the pupil surface PU, of the zero-order diffracted light can be widened. Accordingly, since the incident angles of the zero-order diffracted light and the first-order diffracted light with respect to the imaging plane are increased, the resolution limit of the pattern extending in the y-direction is increased. On the other hand, the interval between the incident position, on the pupil surface PU, of the first-order diffracted light diffracted by the L and S pattern extending in the x-direction and the incident position, on the pupil surface PU, of the zero-order diffracted light is narrow. Therefore, the incident angles of the zero-order diffracted light and the first-order diffracted light with respect to the imaging plane are decreased, and the resolution limit of the pattern extending in the x-direction does not become so high.

FIG. 19 is a diagram for explaining the arrangement positions of openings (dipole) in a filter 1900 according to an embodiment. In an embodiment, the exposure apparatus 100 can be configured to be able to replace the filter 130 with the filter 1900.

The filter 1900 has two openings 1910 and 1930 near the ends in the y-direction. In a certain aspect, the circular filter 1900 can be arranged in such a manner that the light flux emitted from the polarizing member 125 (polarizing unit 1120) comes into contact with each side of a rectangle produced in the x-y plane.

In the x-y plane, it is assumed that the distance from the position of the optical axis AX to the outer peripheral end of the filter 130 is 1 and the position of the optical axis AX is the origin (0, 0). In this case, the centroid positions of the openings 1910 and 1930 are set to (0, 0.7) and (0, −0.7), respectively. In this case, the value of the resolution limit of the pattern extending in the y-direction at the data point B shown in FIG. 18 and the value of the resolution limit of the pattern extending in the x-direction are switched to each other (38 nm in the x-direction and 86 nm in the y-direction).

In another aspect, the centroid positions of the openings 1910 and 1930 are not limited to the above example, and can be arranged in the regions 1920 and 1940, respectively. It should be noted that the openings 1910 and 1930 are also arranged so as to include the boundary position between the light flux entering from the polarizing unit 1110 and the light flux entering from the polarizing unit 1120 in this case.

In the case where the optical axis AX is the origin and the distance from the end of the light flux emitted from the polarizing member 125 (polarizing unit 1120) to the optical axis AX is 1, the region 1920 includes a region ranging from −0.5 to 0.5 in the x-direction and from 0.4 to 0.9 in the y-direction. On the other hand, the region 1940 includes a region ranging from −0.5 to 0.5 in the x-direction and from −0.4 to −0.9 in the y-direction.

In this case, the centroid positions of the openings 1910 and 1930 may be arranged at the boundary position between the light flux entering from the polarizing unit 1110 and the light flux entering from the polarizing unit 1120, or may be arranged at a position deviated from the boundary position. Further, the centroid position of the opening 1910 and the centroid position of the opening 1930 may be arranged symmetrically about the optical axis AX.

FIGS. 20A and 20B are diagrams each explaining an example of the L and S patterns formed on the photomask 140. FIG. 20A shows the L and S patterns extending in the y-direction and in the directions inclined by ±30 degrees from the y-direction. In other words, FIG. 20A shows the L and S patterns aligned in the x-direction and in the directions inclined by ±30 degrees from the x-direction. In the case where any one of the L and S patterns shown in FIG. 20A is included in patterns formed on the photomask 140, the exposure apparatus 100 preferably performs exposure by mounting the filter 130. This is because the resolution of the pattern extending in the y-direction can be increased as compared to that of the pattern extending in the x-direction as shown in FIG. 15 and FIG. 18.

FIG. 20B shows the L and S patterns extending in the x-direction and in the directions inclined by ±30 degrees from the x-direction. In other words, FIG. 20B shows the L and S patterns aligned in the y-direction and in the directions inclined by ±30 degrees from the y-direction. In the case where any one of the L and S patterns shown in FIG. 20B is included in patterns formed on the photomask 140, the exposure apparatus 100 preferably performs exposure by mounting the filter 1900. This is because the resolution of the pattern extending in the x-direction can be increased as compared to that of the pattern extending in the y-direction.

Figure 21:
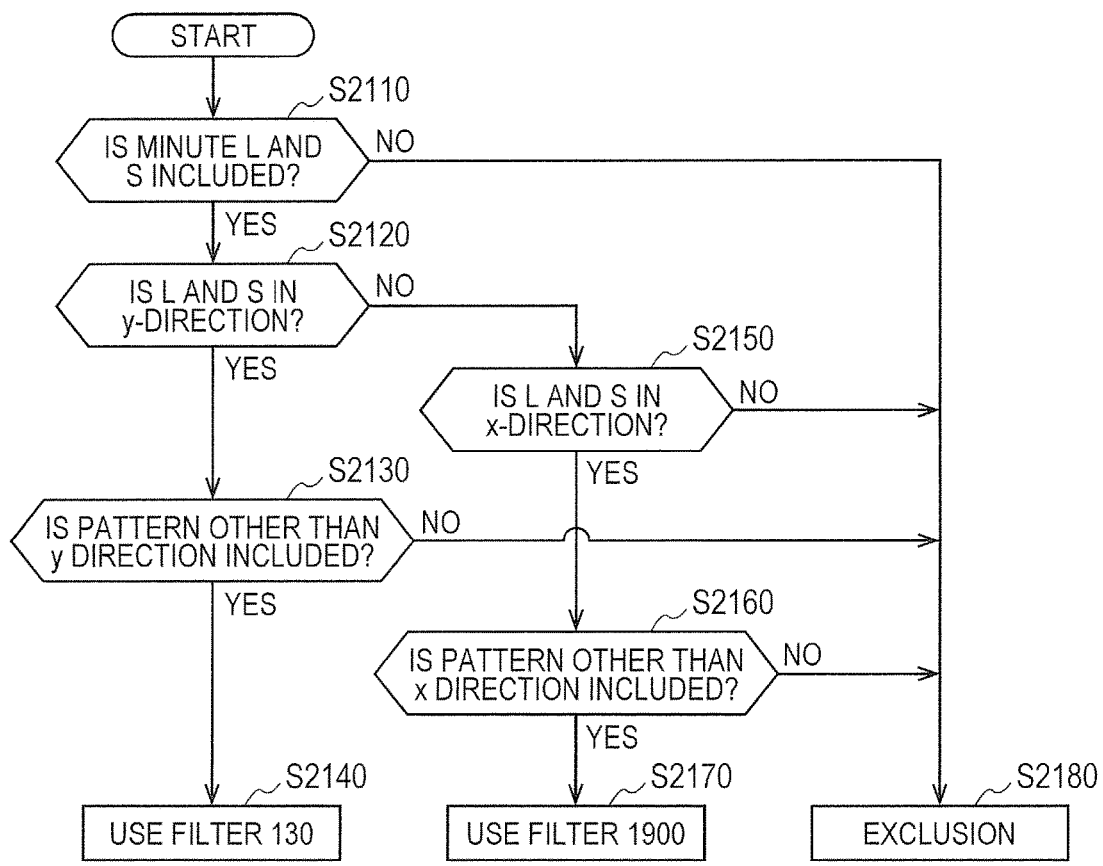
FIG. 21 is a flowchart for explaining an example of a filter selection method in accordance with an exposure pattern according to an embodiment.

The series of filter selection methods will be described in more detail using FIG. 21. FIG. 21 is a flowchart for explaining an example of a filter selection method in accordance with an exposure pattern according to an embodiment. In a certain aspect, the process shown in FIG. 21 can be executed in such a manner that a computer (processor, not shown) mounted on the exposure apparatus performs an image process. In another aspect, the process shown in FIG. 21 can be executed by a computer that accepts the determination result of a user of the exposure apparatus.

In Step S2110, the processor determines whether or not the minute L and S pattern is included in the patterns formed on the photomask 140. In a certain aspect, in the case where the half pitch (half the interval at which lines configuring the L and S pattern are arranged) is smaller than "0.5×λ/NA", it can be determined that the minute L and S pattern is included. It should be noted that "λ" represents the wavelength of the illumination light emitted by the light source 105, and "NA" represents the numerical aperture of the projection optical system 145. In the case where it is determined that the minute L and S pattern is included (YES in Step S2110), the processor advances the process to Step S2120. Otherwise (NO in Step S2110), the processor advances the process to Step S2180.

In Step S2120, the processor determines whether or not the direction in which the minute L and S pattern extends is the y-direction. In a certain aspect, in the case where the direction in which the L and S pattern extends is within ±30 degrees with respect to the y-direction, it can be determined that the direction in which the L and S pattern extends is the y-direction. In the case where the processor determines that the direction in which the minute L and S pattern extends is the y-direction (YES in Step S2120), the process proceeds to Step S2130. Otherwise (NO in Step S2120), the processor advances the process to Step S2150.

In Step S2130, the processor determines whether or not the pattern formed on the photomask 140 includes a pattern other than the y-direction. In a certain aspect, the pattern other than the y-direction represents a pattern (for example, a pattern 710 extending in the x-direction) extending in the direction other than ±30 degrees from the y-direction. In the case where the processor determines that the pattern formed on the photomask 140 includes the pattern other than the y-direction (YES in Step S2130), the process proceeds to Step S2140, and the exposure apparatus 100 with the filter 130 set executes exposure. Accordingly, the exposure apparatus 100 can increase the resolution of the pattern extending in the direction other than the y-direction while significantly increasing the resolution of the L and S pattern extending in the y-direction. On the other hand, in the case where the processor determines that the pattern formed on the photomask 140 does not include the pattern other than the y-direction (NO in Step S2130), the process proceeds to Step S2180.

In Step S2150, the processor determines whether or not the direction in which the minute L and S pattern extends is the x-direction. In a certain aspect, in the case where the direction in which the L and S pattern extends is within ±30 degrees with respect to the x-direction, it can be determined that the direction in which the L and S pattern extends is the x-direction. In the case where the processor determines that the direction in which the minute L and S pattern extends is the x-direction (YES in Step S2150), the process proceeds to Step S2160. Otherwise (NO in Step S2150), the processor advances the process to Step S2180.

In Step S2160, the processor determines whether or not the pattern formed on the photomask 140 includes a pattern other than the x-direction. In a certain aspect, the pattern other than the x-direction represents a pattern (for example, a pattern 410 extending in the y-direction) extending in the direction other than ±30 degrees from the x-direction. In the case where the processor determines that the pattern formed on the photomask 140 includes the pattern other than the x-direction (YES in Step S2160), the process proceeds to Step S2170, and the exposure apparatus 100 with the filter 1900 set executes exposure. Accordingly, the exposure apparatus 100 can increase the resolution of the pattern extending in the direction other than the x-direction while significantly increasing the resolution of the L and S pattern extending in the x-direction. On the other hand, in the case where the processor determines that the pattern formed on the photomask 140 does not include the pattern other than the x-direction (NO in Step S2160), the process proceeds to Step S2180.

In Step S2180, the processor exposes the pattern formed on the photomask 140 by a general exposure method (for example, the exposure apparatus 100R according to the related technique) without using the filters 130 and 1900.

It should be noted that the processor may omit the processes of Step S2130 and Step S2160 in another aspect. Further, in still another aspect, a filter having openings arranged at arbitrary positions in the regions 1420 and 1440 shown in FIG. 14 may be used in Step S2140. As similar to the above, a filter having openings arranged at arbitrary positions in the regions 1920 and 1940 shown in FIG. 19 may be used in Step S2170.

The series of filter selection methods will be described in detail using the examples shown in FIGS. 10A and 10B. The patterns shown in FIG. 10A include a part of the pattern (the pattern corresponding to a part of the metal lines 1020) extending in the y-direction in addition to the minute L and S pattern (the pattern corresponding to the metal lines 1010) extending in the x-direction. Therefore, the processor can expose the patterns using the exposure apparatus 100 with the filter 1900 set. The patterns shown in FIG. 10B include the pattern (the pattern corresponding to a part of the metal lines 1060) extending in the x-direction in addition to the minute L and S pattern (the pattern corresponding to the metal lines 1050) extending in the y-direction. Therefore, the processor can expose the patterns using the exposure apparatus 100 with the filter 130 set.

Further, the filter functions as dipole illumination having two openings in the above-described example, but the number and shapes of the openings are not limited to the example. Specifically, the filter may be configured in such a manner that the light flux emitted from the openings obliquely enters the pattern formed on the photomask 140. In other words, the openings may be arranged in the filter so that the optical axis AX does not penetrate the center of each opening. In another aspect, the filter may have a configuration (annular illumination) having annular openings so as to block the central part including the optical axis. In still another aspect, the filter may have a configuration (quadrupole illumination) having four openings.

Third Embodiment

In the embodiment, an example of a method of manufacturing a semiconductor device using the above-described exposure apparatus 100 will be described.

Figure 22:
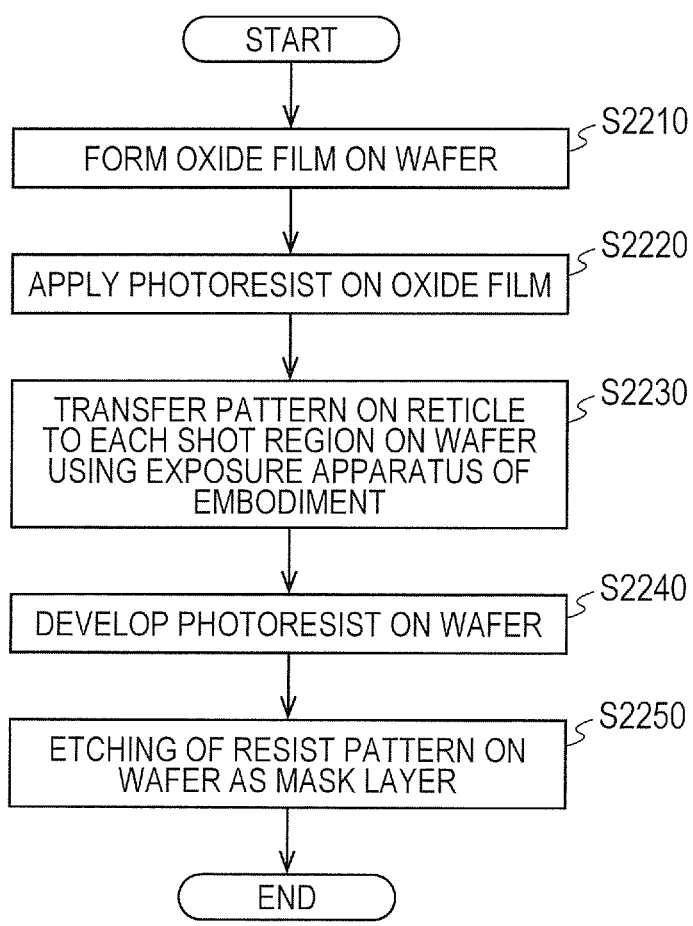
FIG. 22 is a flowchart for explaining an example of a device manufacturing method according to an embodiment.

FIG. 22 is a flowchart for explaining an example of a device manufacturing method according to an embodiment.

In Step S2210, an oxide film is formed on a one-lot wafer. A method of forming the oxide film is not particularly limited, and for example, a thermal oxidation method, a sputtering method, a CDV (Chemical Vapor Deposition) method, or the like can be used.

In Step S2220, a photoresist (photoreceptor) is applied on the formed oxide film. For example, a spin code method or the like can be used when applying the photoresist.

In Step S2230, an image of the pattern on the photomask is sequentially exposed and transferred to each shot region on the one-lot wafer through the projection optical system using the exposure apparatus according to the above-described embodiment.

In Step S2240, the photoresist on the one-lot wafer is developed using a chemical liquid and the like. In Step S2250, etching is performed using the resist pattern as a mask layer on the one-lot wafer. Accordingly, a circuit pattern corresponding to the pattern on the photomask is formed in each shot region on each wafer. Thereafter, a device such as a semiconductor element can be manufactured by further forming a circuit pattern of an upper layer.

According to the above-described semiconductor device manufacturing method, a semiconductor device having minute circuit patterns extending in various directions can be obtained with high throughput. Particularly, a highly-integrated device such as a DRAM (Dynamic Random Access Memory), an SRAM (Static Random Access Memory), or a flash memory is configured using a combination of the L and S pattern extending in the x-direction and the L and S pattern extending in the y-direction as shown in FIG. 10, and thus the usefulness of the exposure apparatus according to the embodiment is high.

[Configurations]

(Configuration 1)

An exposure apparatus (100) according to an embodiment includes a light source (105) emitting illumination light for exposure, a polarizing member (125) polarizing the illumination light, and a filter (130) having at least one opening. The polarizing member includes a first polarizing unit (1110) and a second polarizing unit (1120) arranged so as to surround the first polarizing unit when viewed from the incident direction of the illumination light with respect to the polarizing member. The second polarizing unit is configured so as to polarize at least a part of the illumination light entering the second polarizing unit in the circumferential direction along the outer circumference of the first polarizing unit. At least a portion of the first polarizing unit is configured to polarize the illumination light in the direction orthogonal to the polarization direction in a part of the second polarizing unit located on the side opposite to the central part of the first polarizing unit when viewed from the portion. Openings (132 and 134) are arranged in the filter so that the illumination light at the post stage of the filter and the polarizing member in the optical path of the illumination light includes the illumination light polarized by the first polarizing unit and the illumination light polarized by the second polarizing unit.

Accordingly, the exposure apparatus can increase the resolution of both the pattern extending in a predetermined direction and the pattern extending in the direction orthogonal to the predetermined direction. Thus, the exposure apparatus can increase the resolution of the patterns extending in various directions. As a result, the exposure apparatus can increase the resolution of the patterns including those extending in various directions without using double patterning. Therefore, for example, in the case where a semiconductor device or the like is manufactured using the exposure apparatus, it is possible to reduce the production cost of the semiconductor device and to enhance the production efficiency thereof.

(Configuration 2)

The filter has the two openings (132 and 134).

Accordingly, the illumination light obliquely enters the pattern formed on the photomask from the two openings (dipole illumination). Therefore, the first-order diffracted light can enter the pupil surface PU of the projection optical system. As a result, the resolution can be increased by interference between the zero-order diffracted light and the first-order diffracted light.

(Configuration 3)

The two openings are arranged symmetrically about the optical axis (AX) of the illumination light.

(Configuration 4)

In the optical path of the illumination light, the filter is arranged at the post stage relative to the polarizing member.

(Configuration 5)

The filter has the two openings. The first and second polarizing units polarize the incident illumination light in a first direction (x or y) and a second direction (x or y), respectively, that are orthogonal to each other. The filter includes an irradiation region onto which passing light passing through the polarizing member is irradiated, and is configured to arrange one opening and the other opening of the two openings at a first region (1420) and a second region (1440), respectively. In the case where the distance from the optical axis of the passing light to the end of the irradiation region is 1 in a two-dimensional plane having the optical axis of the passing light as the origin with the first and second directions as the axes, the first region includes a region from +0.4 to +0.9 in the first direction and a region from −0.5 to +0.5 in the second direction. The second region includes a region from −0.4 to −0.9 in the first direction and a region from −0.5 to +0.5 in the second direction.

(Configuration 6)

The first polarizing unit and the second polarizing unit are arranged in the polarizing member so that the distance from the optical axis of the illumination light to the boundary position between the first polarizing unit and the second polarizing unit is 60% to 80% of the distance from the optical axis of the illumination light to the end of the polarizing member.

Accordingly, the exposure apparatus can increase the resolution of the patterns extending more variously (FIG. 15 to FIG. 18).

(Configuration 7)

The second polarizing unit circumferentially polarizes the illumination light entering the unit by polarizing the same in the first direction and the second direction that are orthogonal to each other.

(Configuration 8)

The first and second polarizing units are rectangular.

(Configuration 9)

A photomask (140) with a predetermined pattern formed that is arranged at the post stage of the filter and the polarizing member in the optical path of the illumination light, and a projection optical system (145) that reduces the predetermined pattern in size to be projected onto an irradiated surface (150) are further provided. The predetermined pattern includes repeated patterns (400 and 700) aligned at predetermined intervals in a predetermined direction. The projection optical system is arranged so as to substantially accept only the illumination light polarized by the second polarizing unit among first-order illumination light diffracted by the repeated patterns on a pupil surface (PU) of the projection optical system.

Accordingly, the exposure apparatus can increase the resolution of the pattern extending in the predetermined direction while increasing the resolution of the repeated patterns.

(Configuration 10)

An exposure method for exposing a photosensitive layer includes a step of emitting illumination light from a light source, a step of polarizing the illumination light using a polarizing member, and a step of allowing the polarized illumination light to pass through a filter in which at least one opening is provided. The step of polarizing includes polarizing the illumination light in the circumferential direction along the outer circumference of a first region of the polarizing member in a second region surrounding the first region when viewed from the incident direction of the illumination light with respect to the polarizing member, and polarizing the illumination light in the direction orthogonal to the polarization direction in the second region located on the side opposite to the central part of the first region in at least a portion of the first region when viewed from the portion. The step of allowing the polarized illumination light to pass through includes allowing the illumination light polarized in the first region and the illumination light polarized in the second region to pass through the opening.

According to the exposure method, the resolution of both the pattern extending in a predetermined direction and the pattern extending in the direction orthogonal to the predetermined direction can be increased. According to the exposure method, the resolution of the pattern including patterns extending in various directions can increased without using double patterning. Therefore, for example, in the case where a semiconductor device or the like is manufactured using the exposure method, it is possible to reduce the production cost of the semiconductor device and to enhance the production efficiency thereof.

(Configuration 11)

A device manufacturing method according to an embodiment includes a step (Step S2230) of exposing a pattern on a photosensitive layer on a wafer substrate (150) using the exposure apparatus described in (Configuration 1), a step (Step S2240) of developing the photosensitive layer with the pattern transferred to form a mask layer corresponding to the pattern, and a step (Step S2250) of processing the wafer substrate through the mask layer.

According to the device manufacturing method, it is possible to reduce the production cost of the semiconductor device and to enhance the production efficiency thereof as compared to the past.

(Configuration 12)

The first and second polarizing units polarize the illumination light in the first direction and the second direction, respectively, that are orthogonal to each other. The filter is arranged at the post stage relative to the polarizing member in the optical path. The filter has two openings. The filter includes an irradiation region onto which light passing through the polarizing member is irradiated. One opening of the two openings is configured to be arranged in the first region in the filter, and the other opening of the two openings is configured to be arranged in the second region in the filter. In the case where the distance from the optical axis of the passing light to the end of the irradiation region is 1 in the two-dimensional plane having the optical axis of the passing light as the origin with the first and second directions as the axes, the first region includes a region from +0.4 to +0.9 in the first direction and a region from −0.5 to +0.5 in the second direction. The second region includes a region from −0.4 to −0.9 in the first direction and a region from −0.5 to +0.5 in the second direction. The first polarizing unit and the second polarizing unit are arranged in the polarizing member so that the distance from the optical axis of the illumination light to the boundary position between the first polarizing unit and the second polarizing unit is 60% to 80% of the distance from the optical axis of the illumination light to the end of the polarizing member. The pattern includes repeated patterns in which lines extending in the direction within 30 degrees with respect to the second direction are aligned at predetermined intervals.

According to the device manufacturing method, the resolution of the pattern including patterns extending in more various directions can be increased.

The invention achieved by the inventors has been concretely described above on the basis of the embodiments. However, it is obvious that the present invention is not limited to the above-described embodiments, and can be variously changed without departing from the gist thereof.

What is claimed is:

1. An exposure apparatus comprising:
a light source which emits illumination light for exposure;
a polarizing member which polarizes the illumination light; and
a filter having at least one opening,
wherein the polarizing member and the filter are arranged in an optical path of the illumination light between the light source and a photomask along an optical axis of the illumination light,
wherein the polarizing member includes a first polarizing unit and a second polarizing unit arranged so as to surround the first polarizing unit when viewed in an incident direction of the illumination light on the polarizing member,
wherein the second polarizing unit is configured to polarize at least a part of the illumination light entering the second polarizing unit in a circumferential direction along an outer circumference of the first polarizing unit,
wherein at least a portion of the first polarizing unit is configured to polarize the illumination light in a direction orthogonal to a polarization direction in a part of the second polarizing unit located on a side opposite to a central part of the first polarizing unit when viewed from the portion,
wherein the at least one opening is arranged in the filter such that the illumination light having passed through the filter and the polarizing member includes illumination light polarized by the first polarizing unit and illumination light polarized by the second polarizing unit,
wherein the filter is arranged after the polarizing member in the optical path of the illumination light,
wherein the filter has two openings,
wherein the first and second polarizing units polarize the incident illumination light in a first direction and a second direction, respectively, that are orthogonal to each other,
wherein the filter includes an irradiation region onto which illumination light passing through the polarizing member is irradiated, and is configured to have a first opening and a second opening of the two openings at a first portion of the irradiation region and a second portion of the irradiation region, respectively,
wherein, taking a distance from the optical axis of the illumination light to an edge of the irradiation region as a value of 1 in a two-dimensional plane having the optical axis of the illumination light as the origin with the first and second directions as axes, the first portion of the irradiation region extends from +0.4 to +0.9 in the first direction and from −0.5 to +0.5 in the second direction, and
wherein the second portion of the irradiation region extend from −0.4 to −0.9 in the first direction and from −0.5 to 0.5 in the second direction.

2. The exposure apparatus according to claim 1, wherein the two openings are arranged symmetrically relative to the optical axis of the illumination light.

3. The exposure apparatus according to claim 1, wherein the first polarizing unit and the second polarizing unit are arranged in the polarizing member so that a minimum distance from the optical axis of the illumination light to a boundary position between the first polarizing unit and the second polarizing unit is 60% to 80% of a minimum distance from the optical axis of the illumination light to an edge of the polarizing member.

4. The exposure apparatus according to claim 1,
wherein the second polarizing unit circumferentially polarizes the illumination light entering the unit by polarizing the illumination light in a first direction and a second direction that are orthogonal to each other.

5. The exposure apparatus according to claim 1,
wherein the first and second polarizing units are rectangular.

6. The exposure apparatus according to claim 1, further comprising:
a projection optical system that reduces a predetermined pattern of the photomask in size to be projected onto an irradiated surface,
wherein the predetermined pattern includes repeated patterns aligned at predetermined intervals in a predetermined direction, and
wherein the projection optical system is arranged so that, among first-order illumination light diffracted by the repeated patterns, substantially only illumination light polarized by the second polarizing unit is accepted on a pupil surface of the projection optical system.

7. The exposure apparatus of claim 6,
wherein zero-order diffracted light and first-order diffracted light of the illumination light, diffracted by the predetermined pattern of said photomask, interfere so as to intensify each other on the irradiated surface.

8. The exposure apparatus of claim 1, wherein
the polarizing member comprises a plurality of sectors arranged circumferentially about the optical axis, and
each sector includes, as viewed along the optical axis, a radially inner portion constituted by part of the first polarization unit and a radially outer portion constituted by part of the second polarization unit, the radially inner portion polarizing illumination light in a first polarization direction orthogonal to the optical axis and the radially outer portion polarizing illumination light in a second polarization direction orthogonal to the optical axis and to the first polarization direction.

9. The exposure apparatus of claim 8, wherein vertically opposite sectors are configured to have the same first polarization direction and the same second polarization direction.

10. A device manufacturing method comprising the steps of:
providing an exposure apparatus comprising:
a light source which emits illumination light for exposure;
a polarizing member which polarizes the illumination light; and
a filter having at least one opening,
wherein the polarizing member and the filter are arranged in an optical path of the illumination light between the light source and a photomask along an optical axis of the illumination light,
wherein the polarizing member includes a first polarizing unit and a second polarizing unit arranged so as to surround the first polarizing unit when viewed in an incident direction of the illumination light on the polarizing member,
wherein the second polarizing unit is configured to polarize at least a part of the illumination light entering the second polarizing unit in a circumferential direction along an outer circumference of the first polarizing unit,
wherein at least a portion of the first polarizing unit is configured to polarize the illumination light in a direction orthogonal to a polarization direction in a part of the second polarizing unit located on a side opposite to a central part of the first polarizing unit when viewed from the portion, and
wherein the at least one opening is arranged in the filter such that the illumination light having passed through the filter and the polarizing member includes illumination light polarized by the first polarizing unit and illumination light polarized by the second polarizing unit;
exposing a pattern on a photosensitive layer on a wafer substrate using the exposure apparatus;
developing the exposed photosensitive layer to form a mask layer corresponding to the pattern; and
processing the wafer substrate through the mask layer.

11. The device manufacturing method according to claim 10,
wherein the first and second polarizing units polarize the illumination light in a first direction and a second direction, respectively, that are orthogonal to each other,
wherein the filter is arranged after the polarizing member in the optical path, the filter having two openings, and including an irradiation region onto which light passing through the polarizing member is irradiated,
wherein a first opening of the two openings is arranged in a first region in the filter, and a second of the two openings is arranged in a second region in the filter,
wherein, taking a distance from the optical axis of the passing light to the edge of the irradiation region as a value of 1 in a two-dimensional plane having the optical axis of the illumination light as an origin with the first and second directions as axes, the first region extends from +0.4 to +0.9 in the first direction and −0.5 to +0.5 in the second direction,
wherein the second region extends from −0.4 to −0.9 in the first direction and −0.5 to +0.5 in the second direction,
wherein the first polarizing unit and the second polarizing unit are arranged in the polarizing member so that a distance from the optical axis of the illumination light to the boundary position between the first polarizing unit and the second polarizing unit is 60% to 80% of a distance from the optical axis of the illumination light to the edge of the polarizing member, and
wherein the pattern on the photosensitive layer includes repeated patterns in which lines extending in a direction within 30 degrees with respect to the second direction are aligned at predetermined intervals.

12. An exposure apparatus comprising:
a light source which emits illumination light for exposure;
a polarizing member which polarizes the illumination light; and
a filter having at least one opening;
wherein the polarizing member and the filter are arranged in an optical path of the illumination light along an optical axis of the illumination light,
wherein the polarizing member comprises a plurality of sectors arranged circumferentially about the optical axis,
wherein each sector includes, as viewed along the optical axis, a radially inner portion which polarizes illumination light in a first polarization direction orthogonal to the optical axis and a radially outer portion which polarizes illumination light in a second polarization direction orthogonal to the optical axis and to the first polarization direction, and wherein the at least one opening is arranged in the filter such that the illumination light having passed through the filter and the polarizing member includes illumination light polarized by the first polarizing unit and illumination light polarized by the second polarizing unit.

13. The exposure apparatus of claim 12, further comprising:
a photomask having an exposure pattern; and
a projection optical system that reduces the exposure pattern of the photomask in size to be projected onto an irradiated surface,
wherein the exposure pattern includes repeated patterns aligned at predetermined intervals in a predetermined direction,
wherein the polarizing member and the filter are arranged between the source of illumination light and the photomask in the optical path, and
wherein the projection optical system is arranged so that, among first-order illumination light diffracted by the repeated patterns, substantially only illumination light polarized by the second polarizing unit is accepted on a pupil surface of the projection optical system.

14. The exposure apparatus of claim 12, wherein the filter is arranged after the polarizing member in the optical path.

* * * * *